US011990397B2

(12) United States Patent
Shiroi et al.

(10) Patent No.: US 11,990,397 B2
(45) Date of Patent: *May 21, 2024

(54) SEMICONDUCTOR DEVICE HAVING CONDUCTIVE PATTERNS WITH MESH PATTERN AND DIFFERENTIAL SIGNAL WIRINGS

(71) Applicant: RENESAS ELECTRONICS CORPORATION, Tokyo (JP)

(72) Inventors: Wataru Shiroi, Tokyo (JP); Shuuichi Kariyazaki, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/163,617

(22) Filed: Feb. 2, 2023

(65) Prior Publication Data
US 2023/0187330 A1 Jun. 15, 2023

Related U.S. Application Data

(63) Continuation of application No. 17/144,897, filed on Jan. 8, 2021, now Pat. No. 11,605,581.

(51) Int. Cl.
*H01L 23/498* (2006.01)
*H01L 23/00* (2006.01)

(52) U.S. Cl.
CPC .. *H01L 23/49822* (2013.01); *H01L 23/49816* (2013.01); *H01L 23/49838* (2013.01); *H01L 23/49894* (2013.01); *H01L 24/15* (2013.01)

(58) Field of Classification Search
CPC ......... H01L 23/49822; H01L 23/49816; H01L 23/49838; H01L 23/49894; H01L 24/15
See application file for complete search history.

(56) References Cited

U.S. PATENT DOCUMENTS 10,643,960 B2  5/2020  Kariyazaki et al.
2005/0263884 A1  12/2005  Sawada
(Continued)

FOREIGN PATENT DOCUMENTS

JP  2019-114675 A  7/2019

OTHER PUBLICATIONS

U.S. PTO Non-Final Office Action issued in related parent U.S. Appl. No. 17/144,897, dated Apr. 18, 2022.
(Continued)

*Primary Examiner* — Michael Jung
(74) *Attorney, Agent, or Firm* — Rimon P.C.

(57) ABSTRACT

A semiconductor device comprising a wiring member with which a semiconductor chip is electrically connected including: a first wiring layer having a plurality of first conductive patterns; a second wiring layer arranged next to the first wiring layer in a thickness direction of the wiring member, and having a second conductive pattern; and a third wiring layer arranged next to the second wiring layer in the thickness direction of the wiring member, and having a third conductive pattern. Here, in plan view, a first opening portion of each of two, which are arranged next to each other, of a plurality of first opening portions each penetrating through the second conductive pattern is overlapped with a pair of differential signal wirings contained in plurality of first conductive patterns, and is overlapped with two or more of a plurality of second opening portions each penetrating through the third conductive pattern.

20 Claims, 15 Drawing Sheets

(56) References Cited

U.S. PATENT DOCUMENTS

| | | |
|---|---|---|
| 2015/0214142 A1 | 7/2015 | Kariyazaki et al. |
| 2018/0182700 A1* | 6/2018 | Sato et al. |
| 2019/0206789 A1* | 7/2019 | Kuwajima ............. H01L 28/10 |
| 2020/0100355 A1 | 3/2020 | Choi et al. |
| 2020/0161217 A1 | 5/2020 | Joshi et al. |
| 2021/0296223 A1 | 9/2021 | Oyama et al. |

OTHER PUBLICATIONS

U.S. PTO Notice of Allowance issued in related parent U.S. Appl. No. 17/144,897, dated Nov. 4, 2022.
Entire U.S. PTO associated in related parent U.S. Appl. No. 17/144,897, filed Jan. 8, 2021.
U.S. PTO Notice of Allowance issued in related parent U.S. Appl. No. 17/144,897, dated Jul. 28, 2022.

* cited by examiner

SEMICONDUCTOR DEVICE HAVING CONDUCTIVE PATTERNS WITH MESH PATTERN AND DIFFERENTIAL SIGNAL WIRINGS

CROSS-REFERENCE TO RELATED APPLICATIONS

This is a Continuation of U.S. patent application Ser. No. 17/144,897 filed on Jan. 8, 2021, the entire contents are incorporated in its entirety.

BACKGROUND

The present invention relates to a semiconductor device, and for example, the present invention can be suitably applied to a semiconductor device comprising a wiring member including a thin polyimide film as an insulating layer.

There are disclosed techniques listed below.
[Patent Document 1] Japanese Unexamined Patent Application Publication No. 2019-114675

Patent Document 1 discloses a semiconductor device comprising a wiring substrate on which a semiconductor chip is mounted. Also, Patent Document 1 discloses a wiring layout of each of a pair of differential signal transmitting lines for input signal and a pair of differential signal transmitting lines for output signal that are respectively led out toward a peripheral portion of the wiring substrate in each wiring layer.

SUMMARY

There is a structure, as a technology for realizing a miniaturization of a semiconductor device, that a wiring member (hereinafter may be called "rewiring layer") including a thin polyimide film as an insulating layer and a conductive pattern is arranged on a front surface (mounting surface) side of a semiconductor chip. The rewiring layer can reduce a thickness of the semiconductor device compared to a conventional printed wiring board. However, it is found by the present inventors that in case of the rewiring layer using the thin polyimide film as the insulating layer, there is an issue of an adhesive reliability between the polyimide film and the conductive pattern and/or an issue of a flatness of the conductive pattern to be formed on the polyimide film.

Other objects and novel features will become apparent from the description of this specification and the accompanying drawings.

A semiconductor device according to one embodiment, comprising: a wiring member including a plurality of wiring layers; and a semiconductor chip electrically connecting with the wiring member. Here, the plurality of wiring layers of the wiring member includes: a first wiring layer having a plurality of first conductive patterns each covered with a first polyimide film; a second wiring layer arranged next to the first wiring layer in a thickness direction of the wiring member, and having a second conductive pattern covered with a second polyimide film; and a third wiring layer arranged next to the second wiring layer in the thickness direction of the wiring member, and having a third conductive pattern covered with a third polyimide film. Also, the second wiring layer is arranged between the first wiring layer and the third wiring layer in the thickness direction of the wiring member. Also, the plurality of first conductive pattern includes a pair of differential signal wirings through which a differential signal is to be transmitted. Here, the pair of differential signal wirings has a first differential signal wiring and a second differential signal wiring. Also, the second conductive pattern is a mesh pattern having a plurality of first opening portions each penetrating through the second conductive pattern in the thickness direction of the wiring member. Also, the third conductive pattern is a mesh pattern having a plurality of second opening portions each penetrating through the third conductive pattern in the thickness direction of the wiring member. Further, in plan view, the first opening portion of each of two, which are arranged next to each other, of the plurality of first opening portions is overlapped with both of the first differential signal wiring and the second differential signal wiring, and is overlapped with two or more of the plurality of second opening portions.

Also, a semiconductor device according to another embodiment, comprises: a wiring member including a plurality of wiring layers; and a semiconductor chip electrically connecting with the wiring member. Here, the plurality of wiring layers of the wiring member includes: a first wiring layer having a plurality of first conductive patterns each covered with a first polyimide film; a second wiring layer arranged next to the first wiring layer in a thickness direction of the wiring member, and having a second conductive pattern covered with a second polyimide film; and a third wiring layer arranged next to the second wiring layer in the thickness direction of the wiring member, and having a third conductive pattern covered with a third polyimide film. Also, the second wiring layer is arranged between the first wiring layer and the third wiring layer in the thickness direction of the wiring member. Also, the plurality of first conductive pattern includes a pair of differential signal wirings through which a differential signal is to be transmitted. Here, the pair of differential signal wirings has a first differential signal wiring and a second differential signal wiring. Also, the second conductive pattern is a mesh pattern having a plurality of first opening portions each penetrating through the second conductive pattern in the thickness direction of the wiring member. Also, the third conductive pattern is a mesh pattern having: a plurality of second opening portions each penetrating through the third conductive pattern in the thickness direction of the wiring member; and an intersecting portion arranged within four of the plurality of second opening portions, which are arranged next to one another. Further, in plan view, the first opening portion of each of two, which are arranged next to each other, of the plurality of first opening portions is overlapped with both of the first differential signal wiring and the second differential signal wiring, and is overlapped with the intersecting portion.

DETAILED DESCRIPTION

Figure 1:
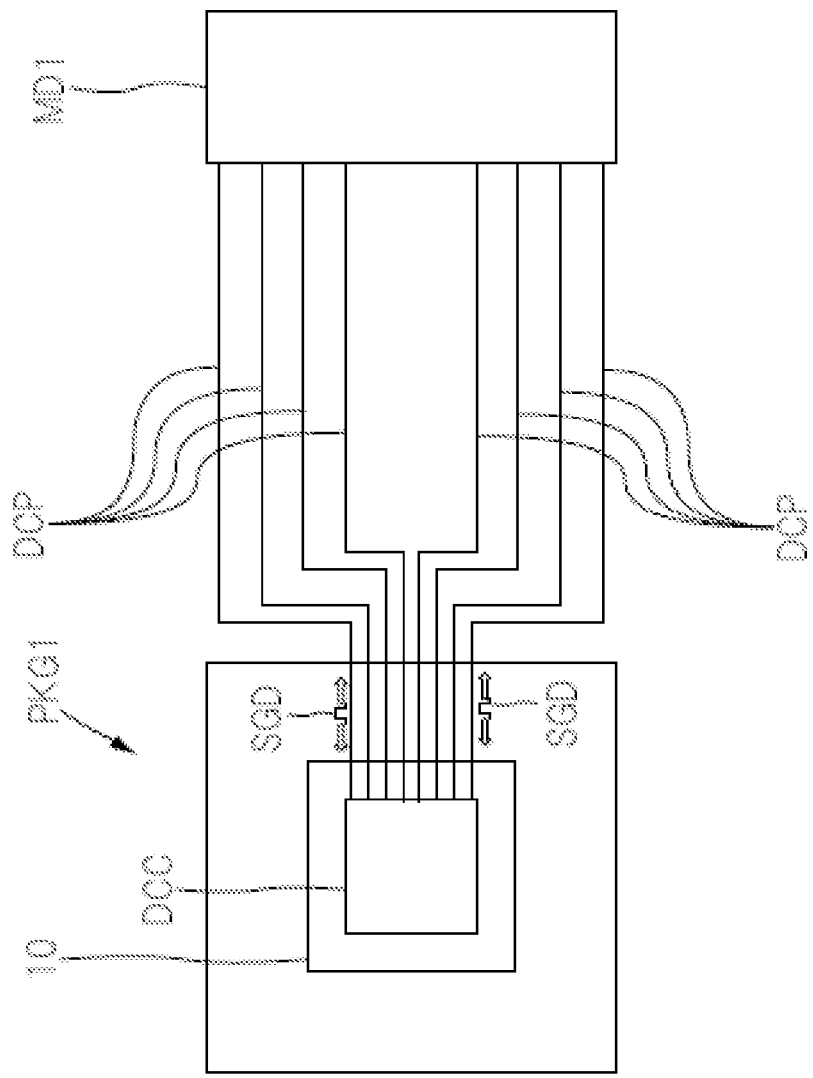
FIG. 1 is an explanatory diagram showing an exemplary configuration of a data communication system including a semiconductor device according to an embodiment.

In the present application, the description of the embodiment will be divided into a plurality of sections or the like as required for convenience, but unless expressly stated otherwise, these are not independent of each other, and each part of a single example, one of which is a partial detail or a part or all of the other, whether before or after the description, or the like, is modified example or the like. In principle, descriptions of similar parts are omitted. Also, each component in an embodiment is not essential, unless expressly stated otherwise, theoretically limited to that number, and obviously otherwise from the context.

Similarly, in the description of the embodiment and the like, "X consisting of A" or the like with respect to the material, composition, and the like does not exclude elements other than A, except when it is clearly indicated that this is not the case and when it is obvious from the context that this is not the case. For example, regarding a component, it means "X including A as a main component" or the like. For example, the term "silicon member" or the like is not limited to pure silicon, and it is needless to say that it also includes a member containing a SiGe (silicon-germanium) alloy, a multi-element alloy containing silicon as its main component, other additives, or the like. In addition, the gold plating, Cu layer, nickel plating, and the like include not only pure materials, but also members containing gold, Cu, nickel, and the like as main components, respectively, unless otherwise specified.

In addition, reference to a specific numerical value or quantity may be greater than or less than that specific numerical value, unless expressly stated otherwise, theoretically limited to that number, and obviously not so from the context. In the following description, a certain value and another value may be referred to as "the same" or "the same", but the meaning of "the same" or "the same" includes strictly the same cases as well as cases in which there is an error within a range that can be considered to be substantially equivalent.

In the drawings of the embodiments, the same or similar parts are denoted by the same or similar symbols or reference numerals, and the description will not be repeated in principle.

In addition, in the attached drawings, hatching and the like may be omitted even in a cross-section when it becomes complicated or when it is clearly distinguished from a gap. In this connection, even if the hole is closed in plan, the outline of the background may be omitted when it is obvious from the description or the like. In addition, hatching or dot patterns may be added to indicate that the region is not a void even if it is not a cross-section or to indicate the boundary of the area.

<Data Communication System>

First, an outline of a data communication system including a semiconductor device of the present embodiment will be described. FIG. 1 is an explanatory diagram showing an exemplary configuration of a data communication system including a semiconductor device according to an embodiment.

As shown in FIG. 1, the semiconductor device PKG1 of the present embodiment has data communication circuits DCC for transmitting data signals SGD to and from an external device, in the embodiment shown in FIG. 1, a memory device MD1. In the embodiment shown in FIG. 1, the data communication circuits DCCs transmit data signals SGD to and from the memory devices MD1. Modified example data communication circuits DCCs may transmit data signals SGD to and from a plurality of memory devices MD1 or electronic devices other than the memory devices MD1. Semiconductor chip 10, other data communication circuit DCC, a logic chip comprising an arithmetic processing circuit for calculating the data.

A data signal SGD, which is a differential signal, is to be transmitted to the data communication path DCP to be connected to the data communication circuit DCC. Therefore, each of the plurality of data communication paths DCP is comprised of two differential signal lines forming a differential pair.

<Semiconductor Device>

Figure 2:
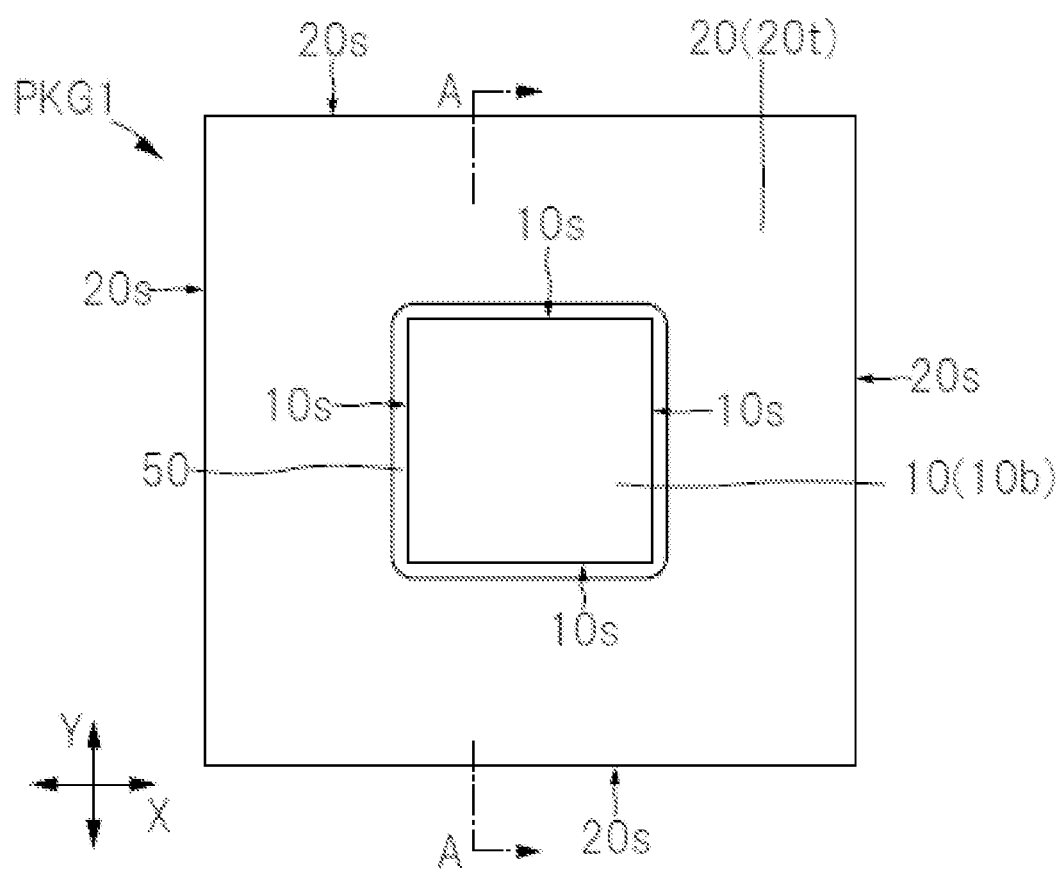
FIG. 2 is a plan view of the semiconductor device shown in FIG. 1, which is viewed from a mounting surface side of a semiconductor chip.
Figure 3:
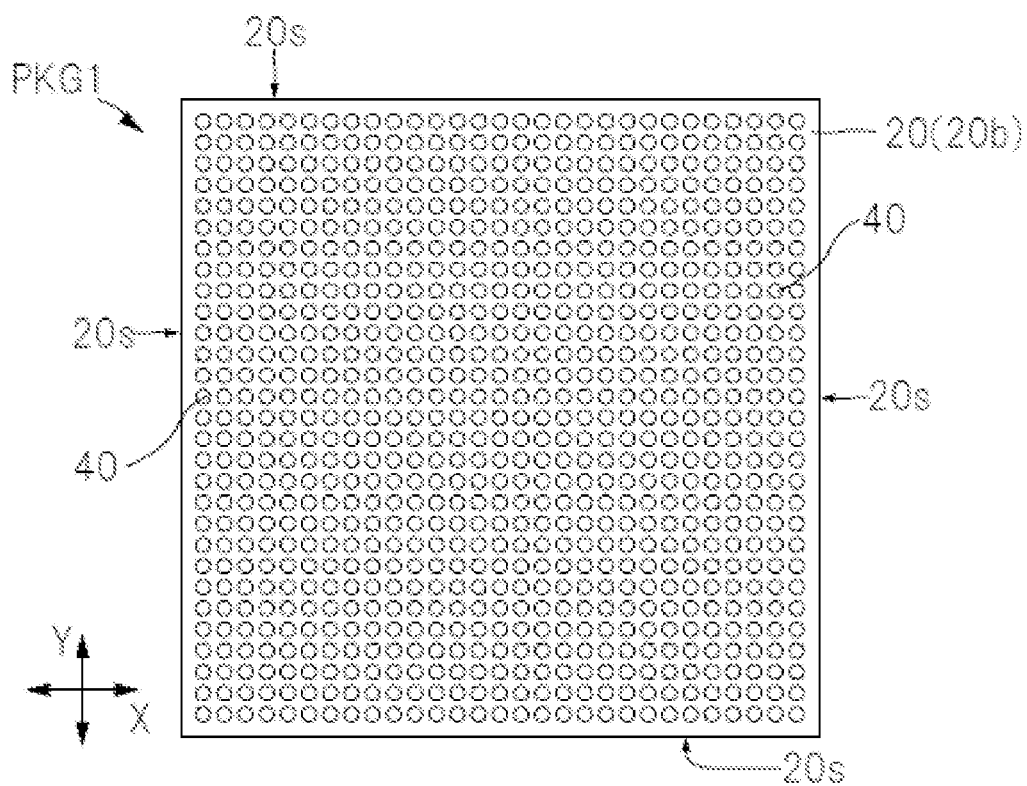
FIG. 3 is a plan view of the semiconductor device shown in FIG. 2, which is viewed from a lower surface side of the semiconductor device shown in FIG. 2.
Figure 4:
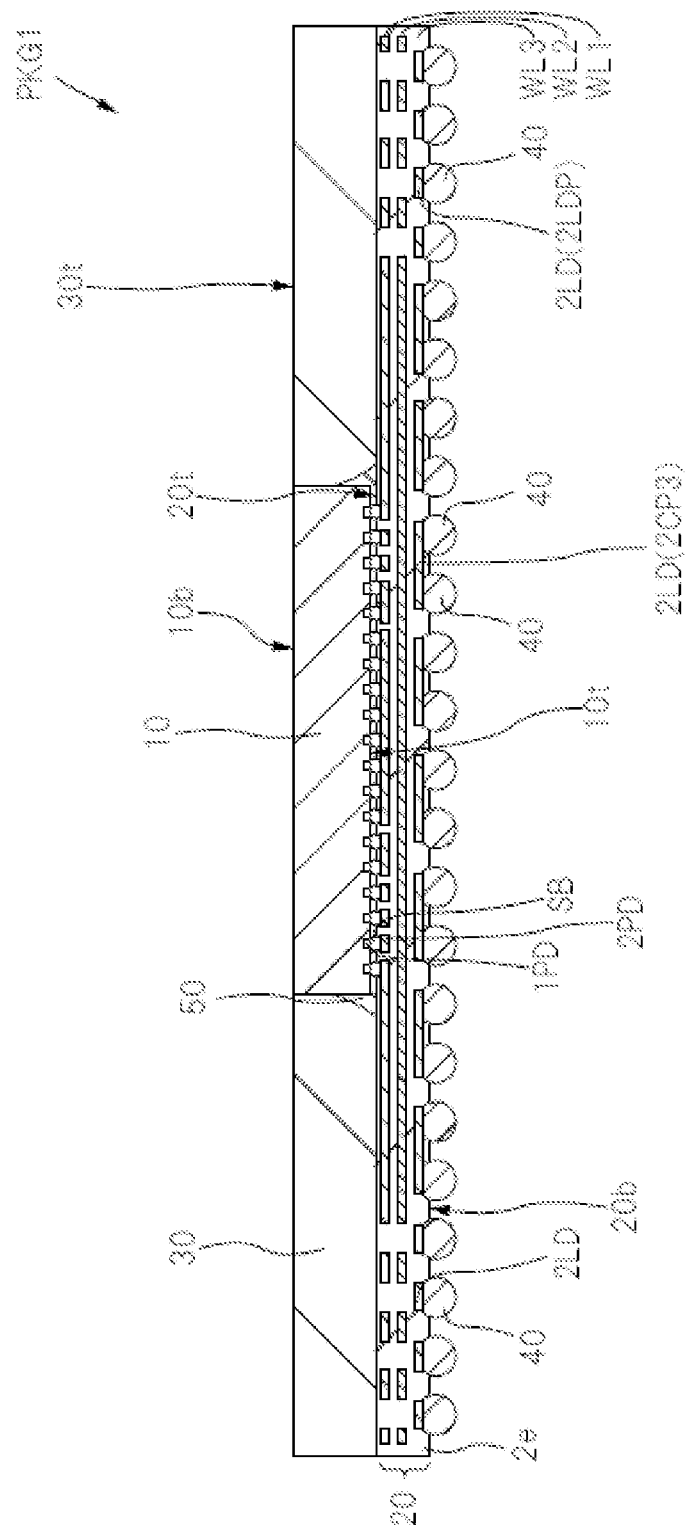
FIG. 4 is a cross-sectional view along line A-A shown in FIG. 2.

Next, an exemplary configuration of semiconductor device PKG1 shown in FIG. 1 will be described. FIG. 2 is a plan view of the semiconductor device shown in FIG. 1, which is viewed from a mounting surface side of a semiconductor chip. FIG. 3 is a plan view of the semiconductor device shown in FIG. 2, which is viewed from a lower surface side of the semiconductor device shown in FIG. 2. FIG. 4 is a cross-sectional view along line A-A shown in FIG. 2. In FIG. 2, in order to clarify the planar positional relationship between the semiconductor chip 10 and the wiring member 20, the sealing body 30 shown in FIG. 4 is not shown.

As shown in FIG. 2, the semiconductor device PKG1 of the present embodiment includes a semiconductor chip 10 and an wiring member 20 on which the semiconductor chip 10 is mounted. Semiconductor chip 10 is disposed on the upper surface 20t of the wiring member 20.

The semiconductor chip 10 has a front surface (main surface, upper surface) 10t (see FIG. 4), the back surface opposite to the front surface 10t (main surface, the lower surface) 10b. Further, the semiconductor chip 10 has four sides 10s positioned at the outer edge in a plan view seen from one side to the other side of the front surface 10t and the back surface 10b. In the example shown in FIG. 2, the semiconductor chip 10 is disposed in the central portion of the upper surface 20t of the wiring member 20. Each of the four sides 10s of the semiconductor chip 10 extends along each of the four sides 20s of the wiring member 20.

As shown in FIG. 4, the surface 10t of the semiconductor chip 10, a plurality of electrodes (chip electrodes, electrode pads, electrode portions) 1PD are arranged. In the present embodiment, a plurality of electrodes 1PD are arranged in a matrix on the front surface 10t of the semiconductor chip 10. By arranging a plurality of electrodes 1PD serving as external input/output terminals of the semiconductor chip 10 in a matrix form, even if the number of electrodes included in the semiconductor chip 10 increases, an increase in the planar area can be suppressed. Further, in plan view, when the electrode 1PD for supplying power to the central portion of the semiconductor chip 10 is disposed, it is possible to shorten the power supply path for the core circuit formed in the central portion of the semiconductor chip 10.

The surface 10t of the semiconductor chip 10 faces the upper surface 20t of the wiring member 20. Thus, the semiconductor chip 10 so as to face the upper surface 20t is the chip mounting surface of the surface 10t is the electrode forming surface of the semiconductor chip 10 is a chip mounting surface of the wiring member 20 is mounted on the wiring member 20 system, a face-down mounting method, or referred to as a flip-chip connecting method. For flip-chip connection method, the terminal 2PD which is arranged in the upper surface 20t of the electrode 1PD and the wiring member 20 to be arranged on the front surface 10t of the semiconductor chip 10 is connected via a protruding electrode SB. As shown in FIG. 4, the protruding electrode SB is connected to each of the plurality of electrode 1PD, a plurality of electrode 1PD of the semiconductor chip 10, and a plurality of terminal 2PD of the wiring member 20, via a plurality of protruding electrodes SB, are respectively electrically connected.

The protruding electrode SB is a metal member formed so as to protrude on the surface 10t of the semiconductor chip 10. In the present embodiment, the protruding electrode SB is a so-called solder bump in which a solder material is laminated on the electrode 1PD with an under-bump metal interposed therebetween. The base metal film can be exemplified by, for example, a laminated film in which titanium (Ti), copper (Cu), and nickel (Ni) are laminated from the connecting surface with the electrodes 1PD (in some cases, a gold (Au) film is further formed on the nickel film). The solder material constituting the solder bumps is, for example, a Sn—Pb solder material containing lead (Pb) or a so-called lead-free solder substantially free of Pb. Examples of lead-free solders include, for example, tin (Sn), tin-bismuth (Sn—Bi), tin-copper-silver (Sn—Cu—Ag), tin-copper (Sn—Cu), and the like. Here, the lead-free solder means a solder in which the content of lead (Pb) is 0.1 wt % or less, and this content is determined as a standard of RoHS (Restriction of Hazardous Substances) instruction.

When mounting the semiconductor chip 10 to the wiring member 20, both the plurality of electrode 1PD and a plurality of terminal 2PD, previously formed solder bumps, by performing heat treatment (reflow process) while contacting the solder bumps to each other, the solder bumps to each other are integrated, the protruding electrode SB is formed. Further, as a modified example for the present embodiment, there is a case where the pillar bump formed with a solder film on the distal end surface of the conductor column made of copper (Cu) or nickel (Ni) is used as the protruding electrode SB.

A plurality of semiconductor elements (circuit elements) are formed on a main surface of the semiconductor chip 10 (more specifically, a semiconductor element forming area provided on an element forming surface of a semiconductor substrate which is a base material of the semiconductor chip 10). A plurality of semiconductor elements is electrically connected with each other, thereby composing a semiconductor circuit. The semiconductor chip 10 includes a plurality of semiconductor circuits, and the plurality of semiconductor circuits includes the data communication circuit DCC shown in FIG. 1. The plurality of electrodes 1PD are electrically connected to the plurality of semiconductor elements via wirings (not shown) formed in wiring layers disposed inside the semiconductor chips 10 (in detail, between the surfaces 10t and semiconductor element forming regions (not shown)).

The semiconductor chip 10 (specifically, semiconductor substrate of the semiconductor chip 10) is made of, for example, silicon (Si). Further, the surface (mounting surface) 10t, an insulating film covering semiconductor substrate and the wiring of the semiconductor chip 10 is formed, each surface of the plurality of electrode 1PD, in the opening formed in the insulating film, is exposed from the insulating film. Each of the plurality of electrodes 1PD is made of metallic, and in the present embodiment, aluminum (Al) or copper (Cu), for example, is made of aluminum (Al) or copper (Cu).

Further, the wiring member 20 on which the semiconductor chip 10 is mounted has the upper surface 20t (refer to FIG. 2) on which the semiconductor chip 10 is mounted, and the lower surface (surface, the main surface, the mounted surface) 20b opposite to the upper surface 20t (see FIG. 3). The wiring member 20 has a rectangular outer shape in plan view. Further, the wiring member 20, in a plan view of the other side from one side of the upper surface 20t and the lower surface 20b has four sides 20s constituting the outer edge of the wiring member 20.

As shown in FIG. 4, the wiring member 20 includes a plurality of conductor patterns, and a polyimide film 2e for insulating between the plurality of conductor patterns. A plurality of conductor patterns having the wiring member 20 includes a plurality of terminals 2PD, a plurality of wirings, a plurality of via wirings, a plurality of lands 2LD, and a conductor plane that is a conductor pattern of a large area.

The wiring member 20 has a plurality of wiring layers for electrically connecting the land 2LD of the lower surface 20b is a terminal 2PD and the mounting surface of the upper surface 20t is a chip mounting surface. In the example shown in FIG. 4, the wiring layer, in order from the upper surface 20t side, has a wiring layer WL1, the wiring layer WL2, and the wiring layer WL3 three layers of the wiring layer. The wiring layer WL1 is a layer in which a plurality of terminals 2PD are formed, and may be replaced with a terminal forming layer. Similarly, the wiring layer WL3 is a layer in which a plurality of lands 2 LD are formed, and may be replaced with a land forming layer. In other words, the wiring 00 member 20 includes a wiring layer WL1 is a terminal forming layer, a wiring layer WL3 is a land forming layer, and a wiring layer WL2 disposed between the wiring layer WL1 and WL3. The wiring layers WL1~WL3 are covered with a polyimide film 2e. The polyimide film 2e covering the respective wiring layers, a plurality of openings is provided, in each of the plurality of openings, via wiring (via, interlayer conductive path) is embedded. Each wiring layer WL1~WL3 is electrically connected via a plurality of via wires.

The upper surface 20t of the wiring member 20, a plurality of terminals electrically connected to the semiconductor chip 10 (terminal portions, pads, semiconductor chip connecting terminals) 2PD are formed. Each of the plurality of terminal 2PD is an internal interface terminal for electrically connecting the semiconductor chip 10 and the wiring member 20. A plurality of lands (terminals, external terminals, electrodes, and external electrodes) 2LD, which are external input/output terminals of semiconductor device PKG1, are formed on the lower surface 20b of the wiring member 20. Land 2LD is an external interface terminal for electrically connecting the wiring member 20 and the external device (e.g., the memory device MD1 shown in FIG. 1). The detailed configuration of the wiring layers included in the wiring member 20 will be described later.

As shown in FIG. 4, each of the plurality of land 2LD, the external terminals (solder balls, solder material, terminals, external terminals, electrodes, external electrodes) 40 are connected. The external terminal 40 is a conductive member that electrically connects a plurality of terminals (not shown) on the mounting substrate side and a plurality of lands 2LD when semiconductor device PKG1 is mounted on a mounting substrate (to be described later). The external terminal 40 is made of, for example, lead-free solder, similarly to the above-described protruding electrode SB.

As shown in FIG. 3, the plurality of external terminals 40 are arranged in a matrix. Further, although not shown in FIG. 3, a plurality of land 2LD in which a plurality of external terminals 40 are joined (see FIG. 4) are also arranged in a matrix. Thus, the mounted surface side of the wiring member 20, a plurality of external terminals (external terminal 40, land 2LD) semiconductor device for arranging in a matrix, referred to as an area-array type semiconductor device. Area array type of semiconductor device, the mounting surface of the wiring member 20 (lower surface 20b) side, it is possible to effectively active as the arrangement space of the external terminals, the mounting area of semiconductor device even if the number of external terminals is increased it is preferable in that it is possible to suppress an increase. In other words, the semiconductor device in which the number of external terminals increases as the function and integration become higher can be mounted in a space-saving manner.

As shown in FIG. 4, an underfill resin 50 is disposed between the semiconductor chip 10 and the wiring member 20. Underfill resin 50 is disposed so as to close the gap between the upper surface 20t of the surface 10t and the wiring member 20 of the semiconductor chip 10. The underfill resin 50 is made of an insulating (non-conductive) material (e.g., a resin material), and is disposed so as to seal an electrical connection portion (a joint portion of the plurality of protruding electrodes SB) between the semiconductor chip 10 and the wiring member 20. Thus, by placing the underfill resin 50 so as to seal the connection portion of the plurality of protruding electrodes SB, it is possible to reduce the stress generated in the electrical connection portion of the semiconductor chip 10 and the wiring member 20.

<Details of Wiring Layout>

Figure 5:
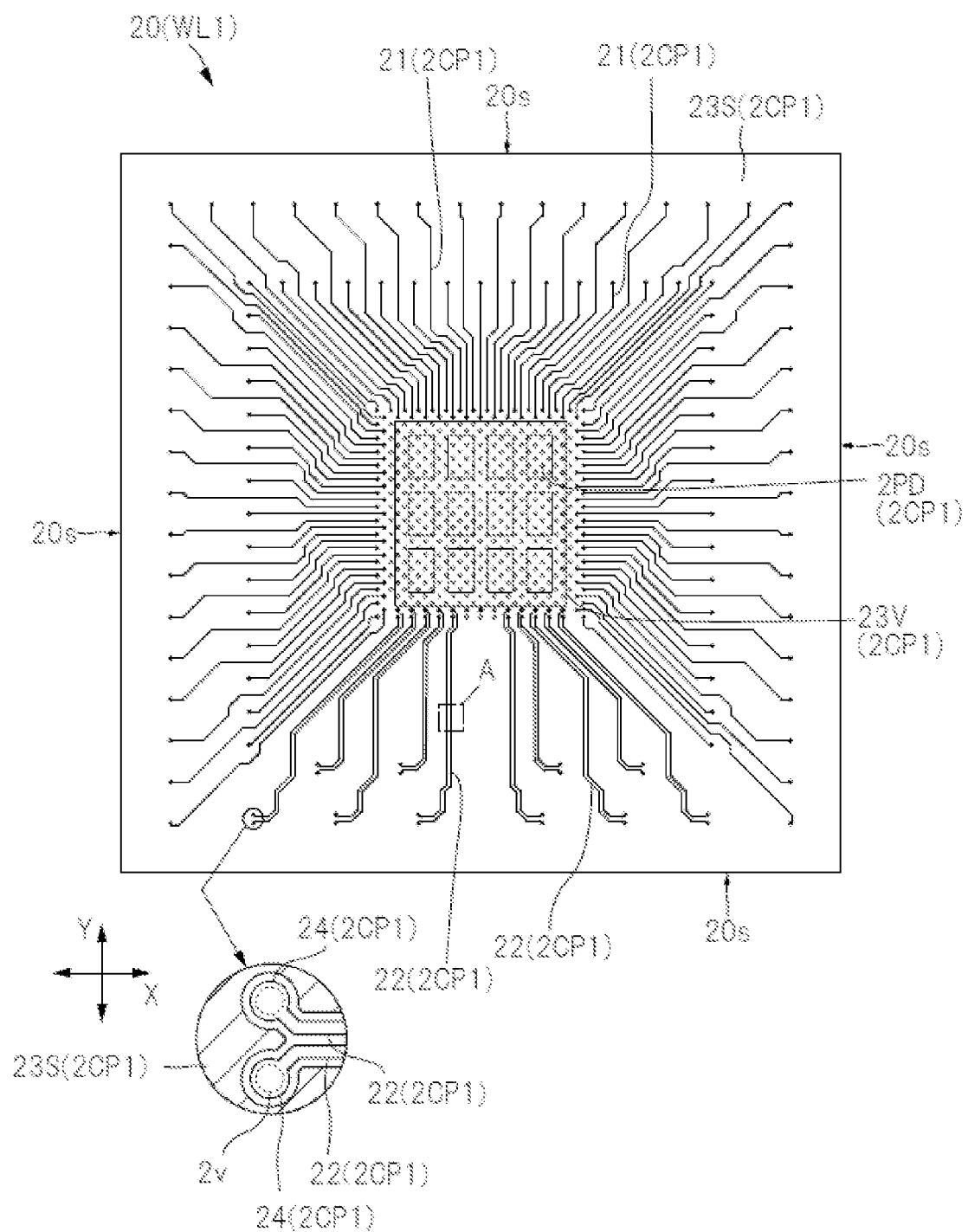
FIG. 5 is a plan view showing a state of removing the semiconductor chip, an uppermost polyimide film and an underfill resin in an upper surface of a wiring member shown in FIG. 2.
Figure 6:
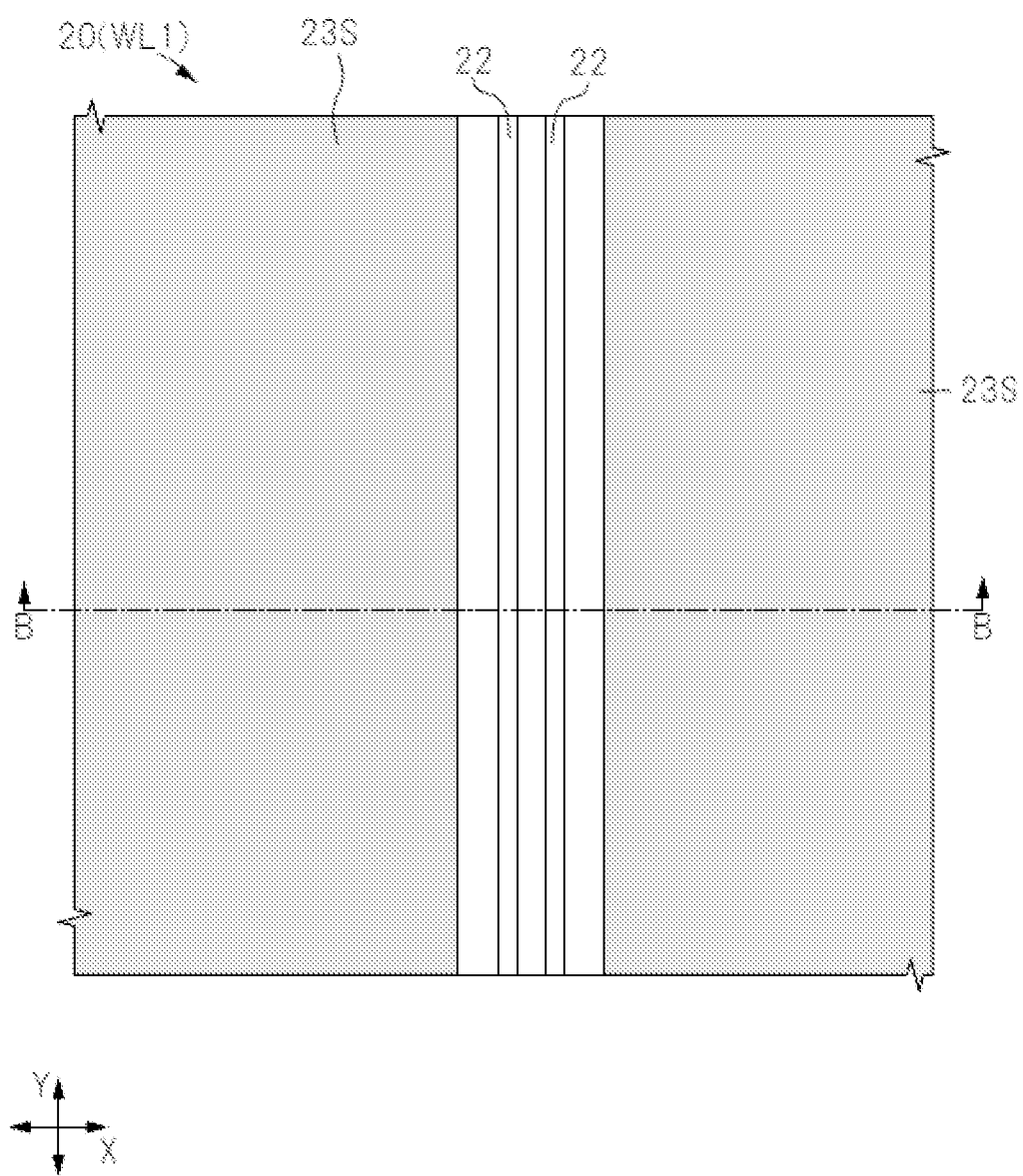
FIG. 6 is an enlarged plan view of at "A" portion of FIG. 5, and showing a state of removing an uppermost insulating film shown in FIG. 5.
Figure 7:
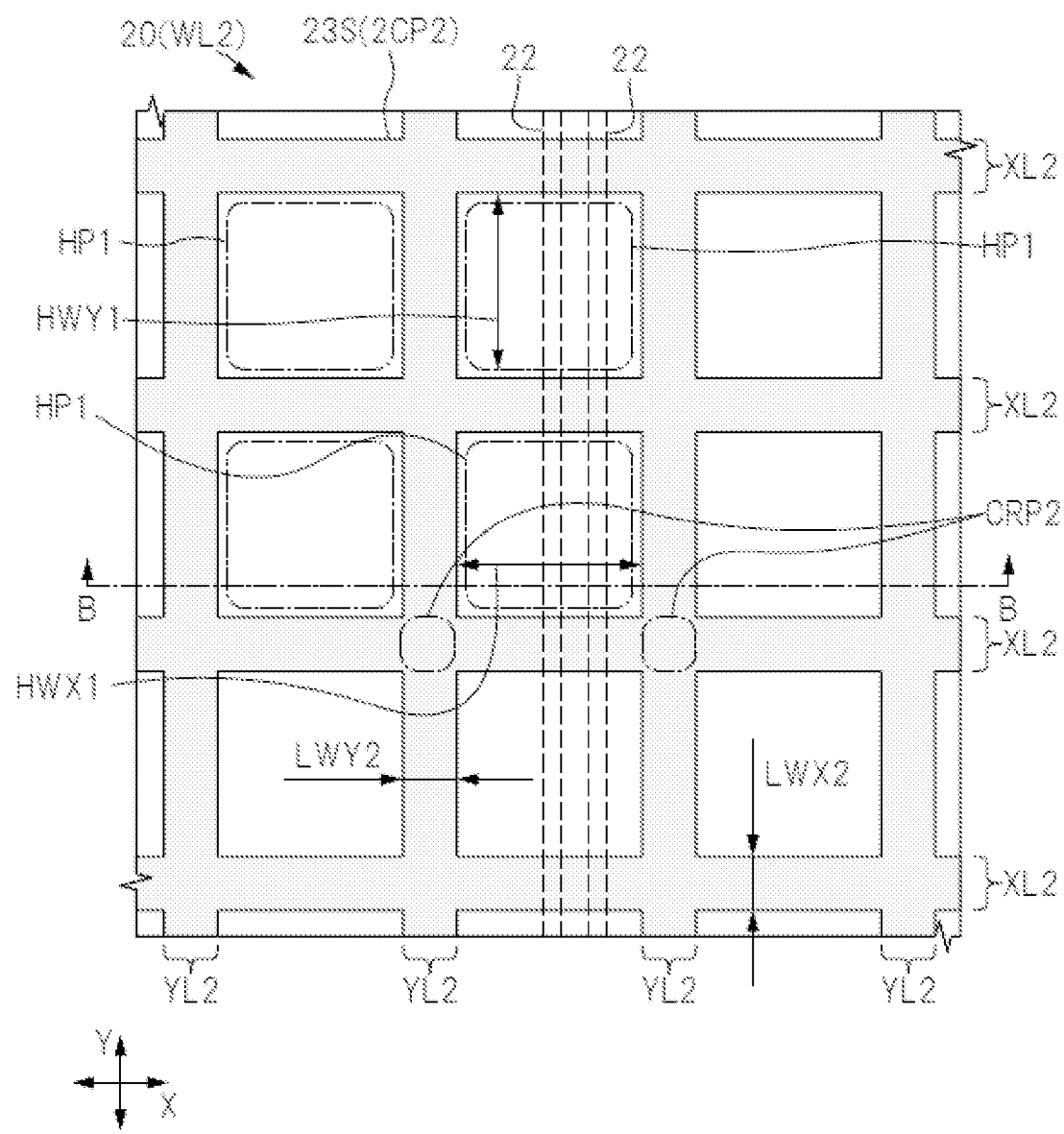
FIG. 7 is an enlarged plan view showing a layout of a second wiring layer located at a position overlapping with the "A" portion of FIG. 5.
Figure 8:
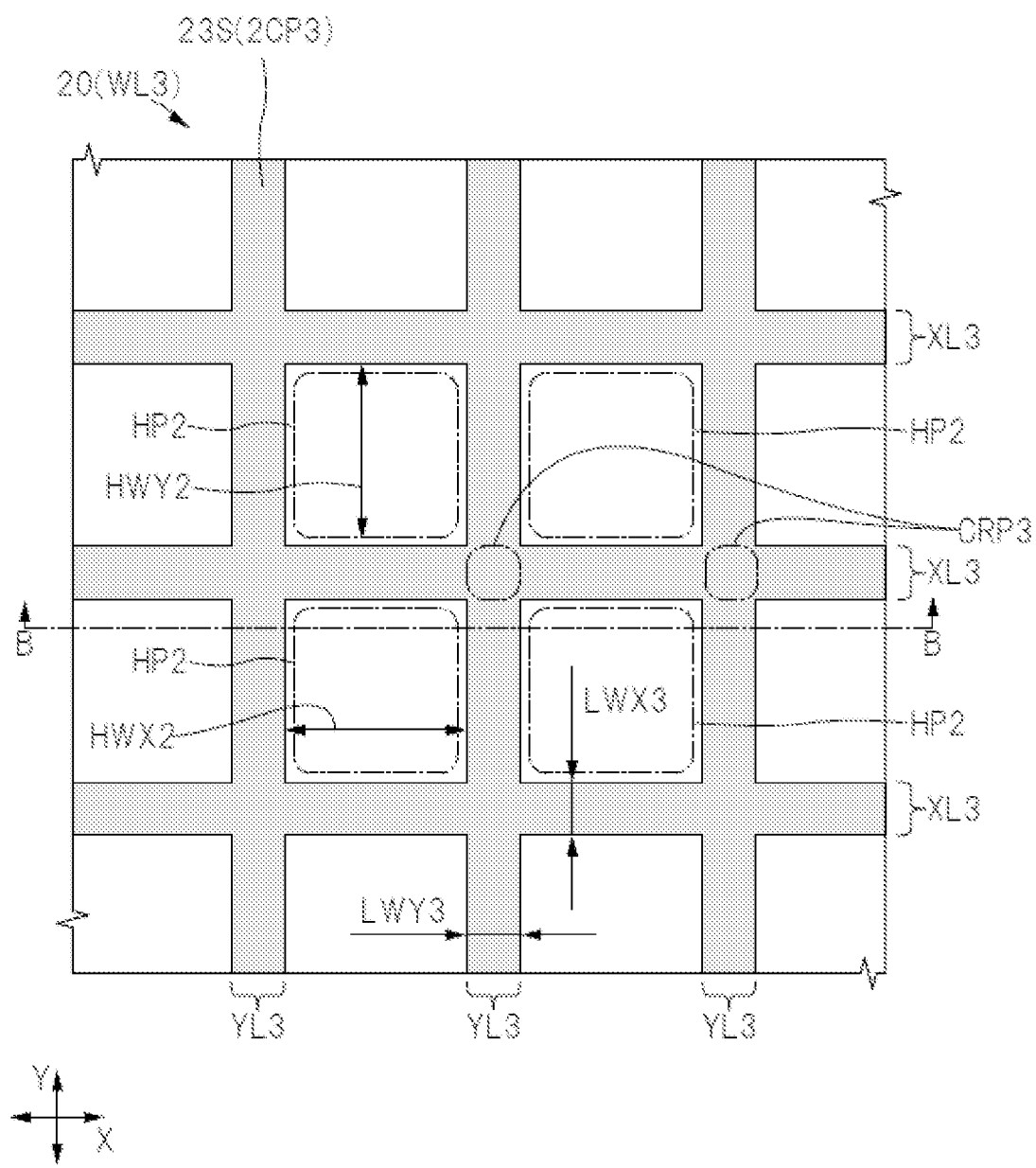
FIG. 8 is an enlarged plan view showing a layout of a third wiring layer located at a position overlapping with the "A" portion of FIG. 5.

It will now be described in detail a wiring layout in each wiring layer contained in the wiring member 20 shown in FIG. 4 by referring to each drawing. FIG. 5 is a plan view showing a state of removing the semiconductor chip, an uppermost polyimide film and an underfill resin in an upper surface of a wiring member shown in FIG. 2. FIG. 6 is an enlarged plan view of at "A" portion of FIG. 5, and showing a state of removing an uppermost insulating film shown in FIG. 5. FIG. 7 is an enlarged plan view showing a layout of a second wiring layer located at a position overlapping with the "A" portion of FIG. 5. FIG. 8 is an enlarged plan view showing a layout of a third wiring layer located at a position overlapping with the "A" portion of FIG. 5. Further, FIGS. 6 to 8 are plan view, in order to easily identify the type of current flowing through the conductor pattern, the conductor pattern on which the reference potential flows is patterned. Also, in the drawings after FIG. 10 described below, patterns are added in the same manner as in FIG. 6.

Figure 9:
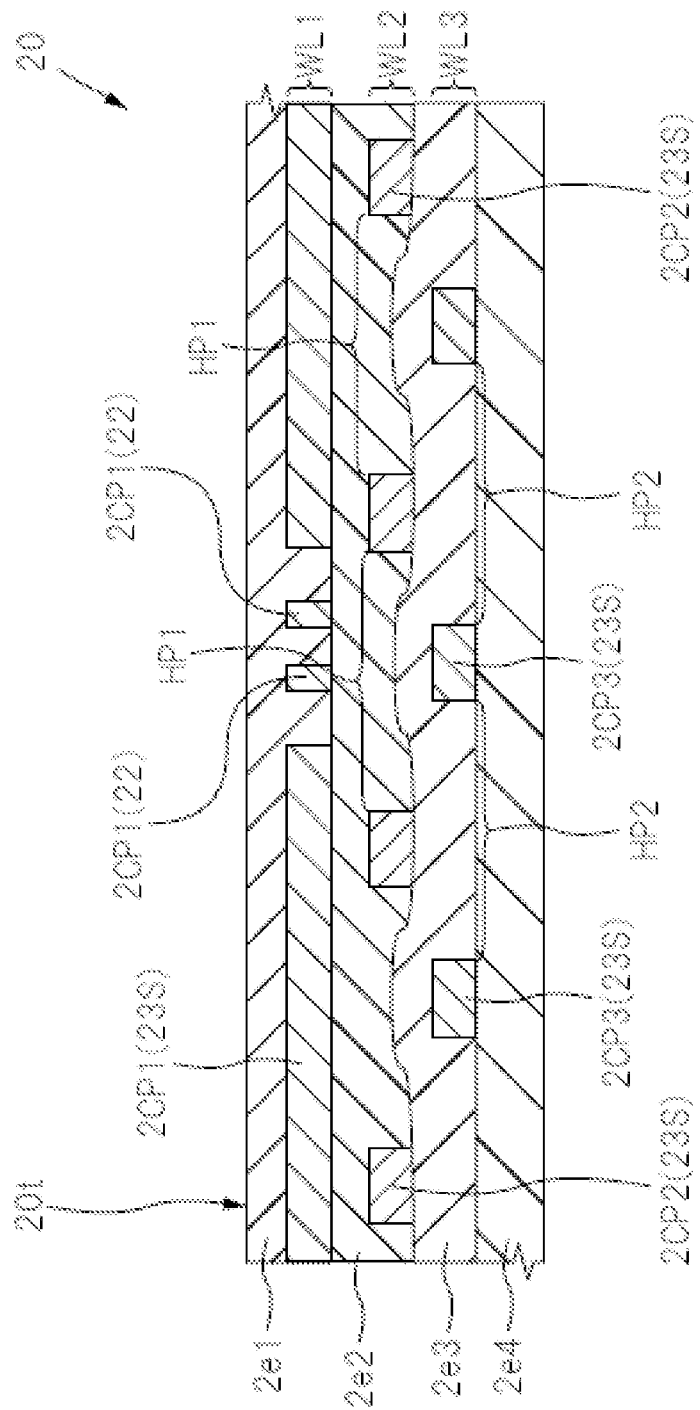
FIG. 9 is an enlarged cross-sectional view along line B-B shown in FIG. 6.
Figure 10:
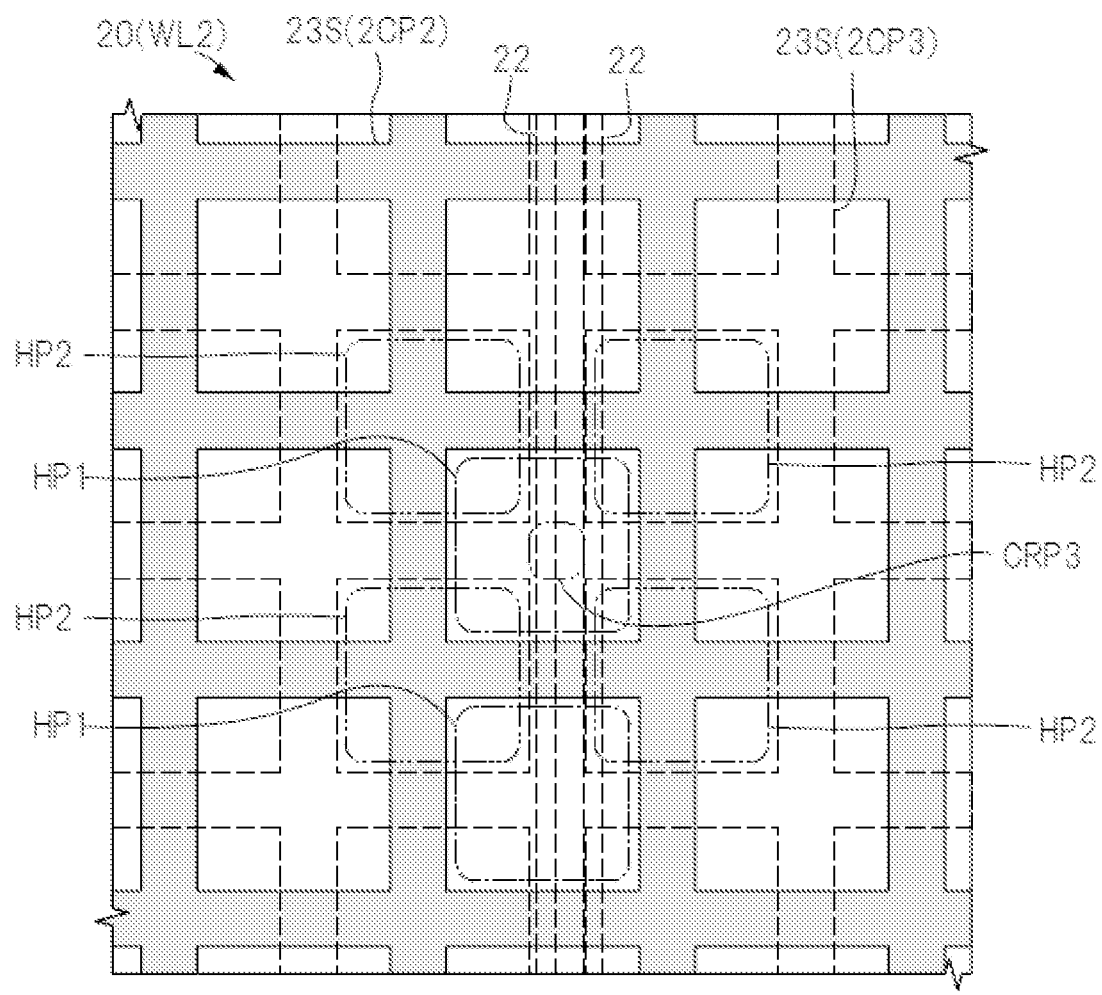
FIG. 10 is an enlarged plan view showing a state that a pair of differential signal wirings shown in FIG. 6, a conductor pattern of the second wiring layer shown in FIG. 7, and a conductor pattern of the third wiring layer shown in FIG. 8 are overlapped with one another.

FIG. 9 is an enlarged cross-sectional view along line B-B shown in FIG. 6. That is, FIG. 9 is a cross-sectional view taken along line B-B of FIG. 6. Also, FIG. 9 is an enlarged cross-sectional view along line B-B shown in FIG. 7 as well. Further, FIG. 9 is an enlarged cross-sectional view along line B-B shown in FIG. 8 as well. Further, FIG. 10 is an enlarged plan view showing a state that a pair of differential signal wirings shown in FIG. 6, a conductor pattern of the second wiring layer shown in FIG. 7, and a conductor pattern of the third wiring layer shown in FIG. 8 are overlapped with one another. In FIG. 10, the differential signal wiring 22 in plan view, the conductor pattern 2CP2, and for explicitly showing the positional relationship of the conductor pattern 2CP3, based on the enlarged plane of the wiring layer WL2 shown in FIG. 7, the differential signal wiring 22 and the conductor pattern 2CP3 It is shown by a dotted line. Further, FIG. 10 shows two of the plurality of opening portions HP1 by a chain line, and shows a portion and the intersecting portion CRP3 of the plurality of openings HP2 by a two-dot chain line.

As shown in FIG. 5, a plurality of conductive patterns 2CP1 each covered with a polyimide film 2e1 (see FIG. 9) is arranged in the wiring layer WL1. A plurality of conductor patterns 2CP1 includes a plurality of signal wires 21 through which a signal is to be transmitted at a first transmission rate (the number of bits transmitted per unit time), and a plurality of differential signal wirings 22 through which the differential signal is to be transmitted at a second transmission rate that is higher speed than the first transmission rate. A plurality of conductor patterns 2CP1 includes a plurality of terminals (pads) 2PD connected to the semiconductor chip 10 (see FIG. 4). Further, a plurality of conductor patterns 2CP1 includes a wiring layer WL1, a plurality of via lands (pads) 24 connected to the via wiring 2v for electrically connecting the wiring layer WL2 of the lower layer of the wiring layer WL1. Further, a plurality of conductor patterns 2CP1 includes a ground plane 23S to which a reference potential is to be supplied, and a power supply plane 23V different from the reference potential is supplied.

The polyimide film 2e1 shown in FIG. 9 is an organic insulating film for protecting the upper surface 20t of the wiring member 20. In the wiring layer WL1, each of the plurality of terminal 2PD (see FIG. 5) is at least partially exposed from the polyimide film 2e1. The other conductive patterns 2CP1 are covered with a polyimide film 2e1.

A plurality of terminal 2PD shown in FIG. 5 includes a plurality of signal terminals connected to the signal wire 21, a plurality of differential signal terminals connected to the differential signal wirings 22, a power supply terminal connected to the power supply plane 23V and to which a power potential is to be supplied, and a ground terminal connected to the ground plane 23S and to which the reference potential is to be supplied. Ground terminal disposed in the vicinity of the plurality of differential signal terminals may be utilized as a path of the reference potential of the differential signal. Note that each of the plurality of signal terminals and a plurality of differential signal terminals, different currents flow from each other. Each of the plurality of signal terminals and the plurality of differential signal terminals has a pad shape separated from each other. On the other hand, the ground terminal and the power supply terminal is formed integrally with the power supply plane 23V or 23S, of the power supply plane 23V and 23S, the portion exposed from the polyimide film 2e1 is regarded as a power supply terminal or ground terminal.

Each of the plurality of terminal 2PD is arranged at a position overlapping with the semiconductor chip 10 shown in FIG. 4. In the region overlapping with the semiconductor chip 10 (see FIG. 4), the signal terminal and the differential signal terminal in the wiring layer WL1 shown in FIG. 5 are arranged at the peripheral portion side of the region overlapping with the semiconductor chip 10. The power supply terminal is arranged at the inner portion side than the signal terminal and the differential signal terminal. The ground terminal is arranged at the vicinity of the signal terminal and the differential signal terminal and also is arranged inner portion side than the signal terminal and the differential signal terminal.

Further, as shown in FIG. 5, each of the plurality of differential signal wiring 22 extends toward one side 20s of the four sides of the wiring member 20 from a region overlapping the semiconductor chip 10 (refer to FIG. 4). Each of the plurality of signal lines 21 extends toward the other three sides 20s of the four sides of the wiring member 20 from the region overlapping the semiconductor chip 10. In the example shown in FIG. 5, for legibility, it illustrates a differential signal wiring 22 of 10 pairs. However, the number of differential signal wiring 22 is not limited to the number illustrated in FIG. 5, as modified example, there is a case where the differential signal wiring 22 of a number different from 10 pairs are arranged. For example, when the number of differential signal wiring 22 is increased, it is necessary to place the differential pair (two pairs of differential signal wirings 22) at a high density, the separation distance of the differential pair adjacent is reduced.

Further, as shown in FIG. 7, the wiring member 20 has a wiring layer WL2 conductor pattern 2CP2 is disposed. As shown in FIG. 9, the wiring layer WL2 in the thickness direction of the wiring member 20 is a wiring layer disposed next to the wiring layer WL1. The conductor pattern 2CP2 is a mesh pattern having a plurality of opening portions HP1 each penetrating through the conductor pattern 2CP2 in the thickness direction of the wiring member 20 (see FIG. 7). Therefore, in the present embodiment, as shown in FIG. 7, a plurality of openings HP1 are provided in a matrix form. In the example shown in FIG. 9, the conductive pattern 2CP2 is a ground plane 23S to which the reference potential is to be supplied.

In case of a conductor pattern 2CP2 to which a fixed potential such as the power supply potential and the reference potential is to be supplied, a pattern of a large area is provided for the purpose of power supply strengthening. However, when a polyimide film is interposed between a plurality of wiring layers as in the case of the present embodiment, the following problems arise when the area of the conductive patterns 2CP2 is simply increased. That is, the linear expansion coefficient of the polyimide film 2e1~2e4 shown in FIG. 9, the difference between the linear expansion coefficient of the respective conductive pattern 2CP1~2CP3 made of, for example, copper or a copper alloy is large. Therefore, in the process of manufacturing semiconductor device or mounting the completed semiconductor device to the mounting substrate (not shown), each polyimide film 2e1~2e4, and each conductive pattern 2CP1~2CP3 is easily peeled off from each other. Further, when the area of the conductive patterns 2CP1~2CP3 increases, the frequency of peeling increases in proportion to the area.

Therefore, in the present embodiment, it forms a plurality of openings HP1 in the conductive pattern 2CP2. As shown in FIG. 9, by providing a plurality of opening portions HP1, the polyimide film 2e2 and the polyimide film 2e3 are brought into close contact with each other in the opening portion HP1. The adhesion force between the polyimide films is large as the adhesion force between the polyimide and the metal. Further, as long as the polyimide films are each other, the coefficient of linear expansion can be substantially the same, so that the occurrence of the above-described peeling can be suppressed. In addition, although the adhesion force between the conductor pattern 2CP2 and the polyimide film 2e2 does not change, by using the conductor pattern 2CP2 as a mesh pattern, the periphery of the conductor pattern 2CP2 is firmly adhered to the mesh pattern. Consequently, it is possible to suppress the occurrence of peeling between the conductive pattern 2CP2 and the polyimide film 2e2.

Further, as shown in FIG. 8, the wiring member 20 has a wiring layer WL3 conductor pattern 2CP3 is disposed. As shown in FIG. 9, the wiring layer WL3 in the thickness direction of the wiring member 20 is a wiring layer disposed next to the wiring layer WL2. That is, in the present embodiment, the wiring layer WL2, in the thickness direction of the wiring member 20, is disposed between the wiring layer WL1 and the wiring layer WL3. The conductor pattern 2CP3 is a mesh pattern having a plurality of opening portions HP2 each penetrating through the conductor pattern 2CP3 in the thickness direction of the wiring member 20 (see FIG. 8). Therefore, in the present embodiment, as shown in FIG. 8, a plurality of opening portions HP2 is provided in a matrix form. In the example shown in FIG. 9, the conductive pattern 2CP3 is a ground plane 23S to which the reference potential is to be supplied. The merit (benefit) that the conductor pattern 2CP3 is the mesh pattern is the same as the reason of the conductor pattern 2CP2 described by referring to FIG. 7. That is, as shown in FIG. 9, by providing a plurality of opening portions HP2, the polyimide film 2e3 and the polyimide film 2e4 are brought into close contact with each other in the opening portion HP2. As a result, peel between the conductive patterns 2CP3 and the polyimide film 2e3 can be suppressed.

As described above, by using the large-area conductor pattern as the mesh pattern, the separation between the conductor pattern and the polyimide film can be suppressed. However, according to the studies of the present inventors, by each of the conductor pattern 2CP2 and the conductor pattern 2CP3 and the mesh pattern, it was found that a new problem occurs. That is, as exemplarily shown in FIG. 9, the surfaces of the polyimide film 2e2 and the conductor pattern 2e3 become concavo-unevenness surfaces following the shapes of the conductor patterns formed in the underlying wiring layers. Therefore, for example, a conductor pattern 2CP2, when the conductor pattern 2CP3 is completely overlapped in the thickness direction, the unevenness at the surface of the polyimide film 2e2 is extremely large. The polyimide film 2e2 is a base layer for forming the differential signal wiring 22. If the irregularities of the surface of the polyimide film 2e2 is large, when forming the differential signal wirings 22 using a photolithography technique, causing problems such as blurred exposure image. When such a trouble occurs, anomaly in the wiring width of the differential signal wiring 22, or, there is a case where an abnormality in the separation distance of the adjacent wiring occurs. Further, the differential signal wiring 22 may be formed in a shape such as wavy in the thickness direction of the wiring member 20. If the respective thicknesses of the polyimide film 2e2 and the conductive patterns 2e3 are made sufficiently thick, the degree of unevenness can be reduced. However, in this case, since the thickness of the wiring member 20 is increased, contrary to the demand for thinning for semiconductor device.

Therefore, the inventor of the present application has investigated a technique for reducing the unevenness of the polyimide film 2e2, and has found a configuration of the present embodiment. That is, as shown in FIG. 10, in plan view, the opening portion HP1 of each of two, which are arranged next to each other, of the plurality of opening portions HP1 of the conductive pattern 2CP2 is overlapped with the pair of differential signal wirings (one differential signal wiring and the other one differential signal wiring) 22, and is overlapped with two or more of the plurality of opening portions HP2. In the present embodiment, as shown in FIG. 10, of the plurality of opening portions HP1 of the conductive patterns 2CP2, at least two opening portions HP1 adjacent to each other (e.g., two openings indicated by the symbol "HP1" in FIG. 10) overlap with four of the plurality of openings HP2. In other words, the conductor pattern 2CP2 of the wiring layer WL2, each of the conductor pattern 2CP3 of the wiring layer WL3 is a mesh pattern, in a plan view, the position of each opening portion HP1 and HP2 of the mesh pattern are arranged so as to be displaced from each other.

The wiring layout shown in FIGS. 7 to 10 can also be expressed as follows. That is, the conductor pattern 2CP3 is a mesh pattern having a plurality of opening portions HP2 each penetrating through the conductor pattern 2CP3 in the thickness direction of the wiring member 20, and an intersecting portion CRP3 arranged within the four, which are adjacent to one another, of the plurality of opening portions HP2. In plan view, the opening portion HP1 of each of two (e.g., two indicated by reference numeral "HP1" in FIG. 7), which are arranged next to each other, of the plurality of opening portions HP1 of the conductive pattern 2CP2 is overlapped with the pair of differential signal wirings (one differential signal wiring and the other one differential signal wiring) 22, and is overlapped with the intersecting portion CRP3. The entire intersecting portion CRP3 of the conductor pattern 2CP3 overlaps the opening portion HP1 of the wiring layer WL2. That is, when viewed overlapping the three wiring layer WL1~WL3 as shown in FIG. 10, a portion of the pair of differential signal wirings 22, the intersecting portion CRP3 of the conductor pattern 2CP3 is located in the opening portion HP1 of one of the plurality of opening portions HP1 in the wiring layer WL2.

If the conductor pattern 2CP2 and the conductor pattern 2CP3 is arranged, as shown in FIG. 9, the convex portion of the polyimide film 2e3 formed on the conductor pattern 2CP3 is formed in the opening portion HP1 of the conductor pattern 2CP2. Therefore, the concavo-unevenness surface of the polyimide film 2e3 formed due to the mesh pattern of the conductor pattern 2CP3 and the concavo-convex surface of the polyimide film 2e2 formed due to the mesh pattern of the conductor pattern 2CP2 cancel each other, and upper surface of the polyimide film 2e2 is flattened as shown in FIG. 9. As a result, in the step of forming the differential signal wiring 22 on the polyimide film 2e2, it is possible to suppress the occurrence of the above-described trouble in the exposure step. Further, the differential signal wiring 22 can be suppressed to be formed in a shape such as wavy in the thickness direction of the wiring member 20.

Incidentally, since the conductor pattern 2CP2 and the conductor pattern 2CP3 is a mesh pattern respectively, each of the conductor pattern 2CP2 and the conductor pattern 2CP3 also includes portions overlapping each other. However, according to the study by the inventor of the present application, by arranging the entire intersecting portion CRP3 so as to overlap with the opening portion HP1, the flatness of upper surface of the polyimide film 2e2 is improved to such an extent that the differential signal wiring 22 can be formed within the limit of the design margins. That is, if the entire of the intersecting portion CRP3 overlaps with the opening portion HP1, it is possible to arrange the differential signal wiring 22 substantially as designed while securing the adhesion between the conductive patterns 2CP2 and 2CP3 and the polyimide film.

Next, a preferable relationship between the openings HP1 and HP2 shown in FIG. 10 and the conductor patterns 2CP2 and 2CP3 will be described. As shown in FIG. 7, the conductor pattern 2CP2 has a plurality of extending portion XL2 extended in the X direction, and a plurality of extending portion YL2 extended in the Y direction intersecting (perpendicular in FIG. 7), the X direction. A space surrounded by a plurality of extending portions XL2 and YL2 crossing each other is an opening portion HP1. The conductive patterns 2CP2 have intersecting portions CRP2 at positions where the plurality of extending portions XL2 and the plurality of extending portions YL2 intersect with each other, respectively. The plurality of extending portions XL2 and the plurality of extending portions YL2 are arranged at equal intervals. Each of the plurality of extending portions XL2 comprises a width (line width) LWX2 extended in the Y direction, each of the plurality of extending portions YL2 comprises a width (line width) LWY2 extended in the X direction. The opening portion HP1 includes an opening width HWX1 extended in the X direction, and an opening width HWY1 extended in the Y direction.

Similarly, as shown in FIG. 8, the conductor pattern 2CP3 has a plurality of extending portion XL3 extended in the X direction, and a plurality of extending portion YL3 extended in the Y direction. A space surrounded by a plurality of extending portions XL3 and YL3 crossing each other is an opening portion HP2. The conductive patterns 2CP3 have intersecting portions CRP3 at positions where the plurality of extending portions XL3 and the plurality of extending portions YL3 intersect with each other, respectively. The plurality of extending portions XL3 and the plurality of extending portions YL3 are arranged at equal intervals. Each of the plurality of extending portions XL3 comprises a width (line width) LWX3 extended in the Y direction, each of the plurality of extending portions YL3 comprises a width (line width) LWY3 extended in the X direction. The opening portion HP2 includes an opening width HWX2 extended in the X direction, and an opening width HWY2 extended in the Y direction. In the examples shown in FIGS. 7 to 10, the opening portion HP1 and the opening portion HP2 have identical shapes. Further, each of the plurality of extending portion XL2 and a plurality of extending portion YL2 shown in FIG. 7, and each of the plurality of extending portion XL3 and a plurality of extending portion YL3 shown in FIG. 8, except that the position in a plan view is different, it forms the same shape to each other.

As described above, from the viewpoint of suppressing the separation between the polyimide film 2e2 and the conductive patterns 2CP2, it is preferable that the opening area of the opening portion HP1 be large. In the embodiment shown in FIG. 7, the opening width HWX1 is larger than the width LWY2 of the extending portion YL2. By increasing the opening widths HWX1 of the opening portions HP1 in this manner, the contact areas between the polyimide films in the X-direction are increased. Consequently, it is possible to improve the adhesion strength between the polyimide film 2e2 and the polyimide film 2e3 shown in FIG. 9. Further, as shown in FIG. 7, it is more preferable that each opening width HWX1, HWY1 is larger than each width LWY2, LWX2. Incidentally, the "width LWX2" referred to here is the length of the conductor pattern 2CP2 in the Y-direction of FIG. 7. Further, the "width LWY2" is the length of the conductor pattern 2CP2 in the X-direction of FIG. 7.

Focusing on the relationship between the conductor pattern 2CP2 shown in FIG. 7 and the conductor pattern 2CP3 shown in FIG. 8 is as follows. That is, the extending portion YL3 of the conductive patterned 2CP3 shown in FIG. 8 comprises a width (linewidth) LWY3. Incidentally, the "width LWY3" referred to here is the length of the conductor pattern 2CP3 in the X-direction of FIG. 8. The opening width HWX1 of the opening portion HP1 shown in FIG. 7 is preferably larger than the width LWY3 of the extending portion YL3 shown in FIG. 8. Thus, in the X direction, it is possible to reduce the area of the portion where the conductor pattern 2CP2 and the conductor pattern 2CP22CP3 overlap each other. Further, in both the X direction and the Y direction, in order to reduce the area of the portion where the conductor pattern 2CP2 and the conductor pattern 2CP3 overlap each other, in addition to the conditions in the X direction described above, it is preferable to also adopt the condition in the Y direction. That is, as a condition in the Y-direction, it is more preferable that the opening width HWY1 of the opening portion HP1 shown in FIG. 7 is larger than the width LWX3 of the extending portion XL3 shown in FIG. 8. Note that the "width LWX3" referred to here is the length of the conductor pattern 2CP3 in the Y-direction of FIG. 8.

Further, from the viewpoint of suppressing the separation of the polyimide film 2e3 and the conductive patterns 2CP3 shown in FIG. 9, it is preferable to increase the adhesion area between the polyimide film 2e3 and the polyimide film 2e4. Therefore, it is more preferable that each opening width HWX2, HWY2 shown in FIG. 8 is larger than each width LWY3, LWX3. From the viewpoint of increasing the adhesion area between the polyimide film 2e3 and the polyimide film 2e4, it can be expressed as follows. That is, in the wiring layer WL3 shown in FIG. 8, the total area of the plurality of openings HP2 is preferably equal to or larger than 50% of the area of the conductor pattern 2CP3 including a plurality of openings HP2. In addition, from the viewpoint of increasing the adhesion area between the polyimide film 2e2 and the polyimide film 2e3 shown in FIG. 9, it is preferable that the total area of the plurality of opening portions HP1 in the wiring layer WL2 shown in FIG. 7 is equal to or larger than 50% of the area of the conductive patterns 2CP2 including the plurality of opening portions HP1.

Further, from the viewpoint of reducing the noise effect from the mesh pattern of the wiring layer WL2 to the differential signal, which is to be transmitted to the differential signal wiring 22 shown in FIG. 6, the following configuration is preferable. That is, among the plurality of openings HP1 shown in FIG. 7, at least, the opening width HWY1 of the opening portion HP1 disposed at a position overlapping the differential signal wiring 22 is preferably 1/16 (one sixteenth) or less with respect to the wavelength of the differential signal. In the example shown in FIG. 7, the opening width HWY1 and HWX1 are the same value. If the value of the opening width HWY1 and the opening width HWX1 is different, at least, the opening width of the direction coinciding with the extending direction of the differential signal wiring 22 (in the case of FIG. 7, the opening width HWY1 is preferably 1/16 or less with respect to the wavelength of the differential signal.

<Relationship with Land>

Figure 11:
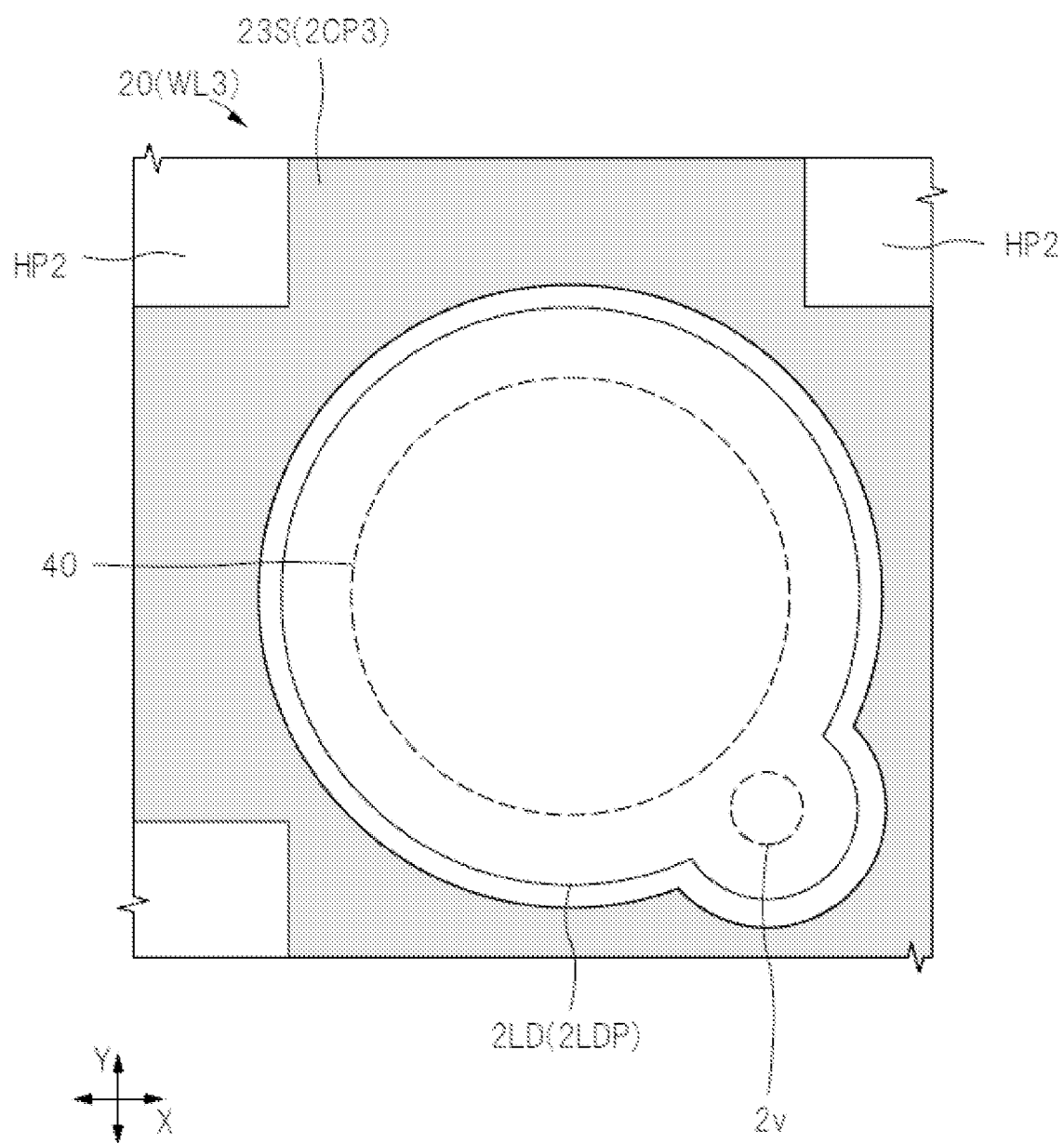
FIG. 11 is an enlarged plan view showing one of a plurality of land pads connected with the semiconductor chip shown in FIG. 4.
Figure 12:
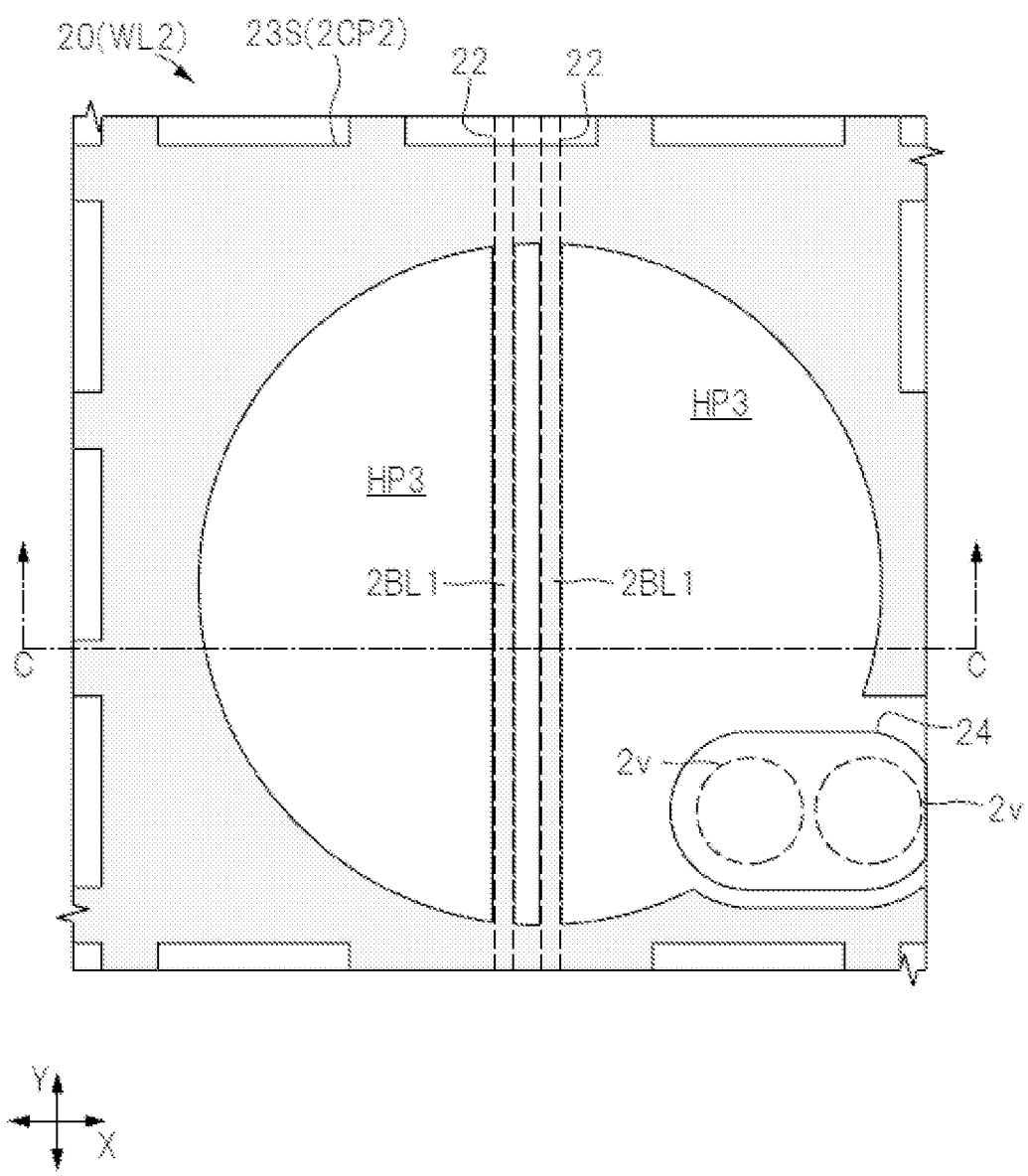
FIG. 12 is an enlarged plan view showing the layout of the second wiring layer located at a position overlapping with the enlarged plan view shown in FIG. 11.
Figure 13:
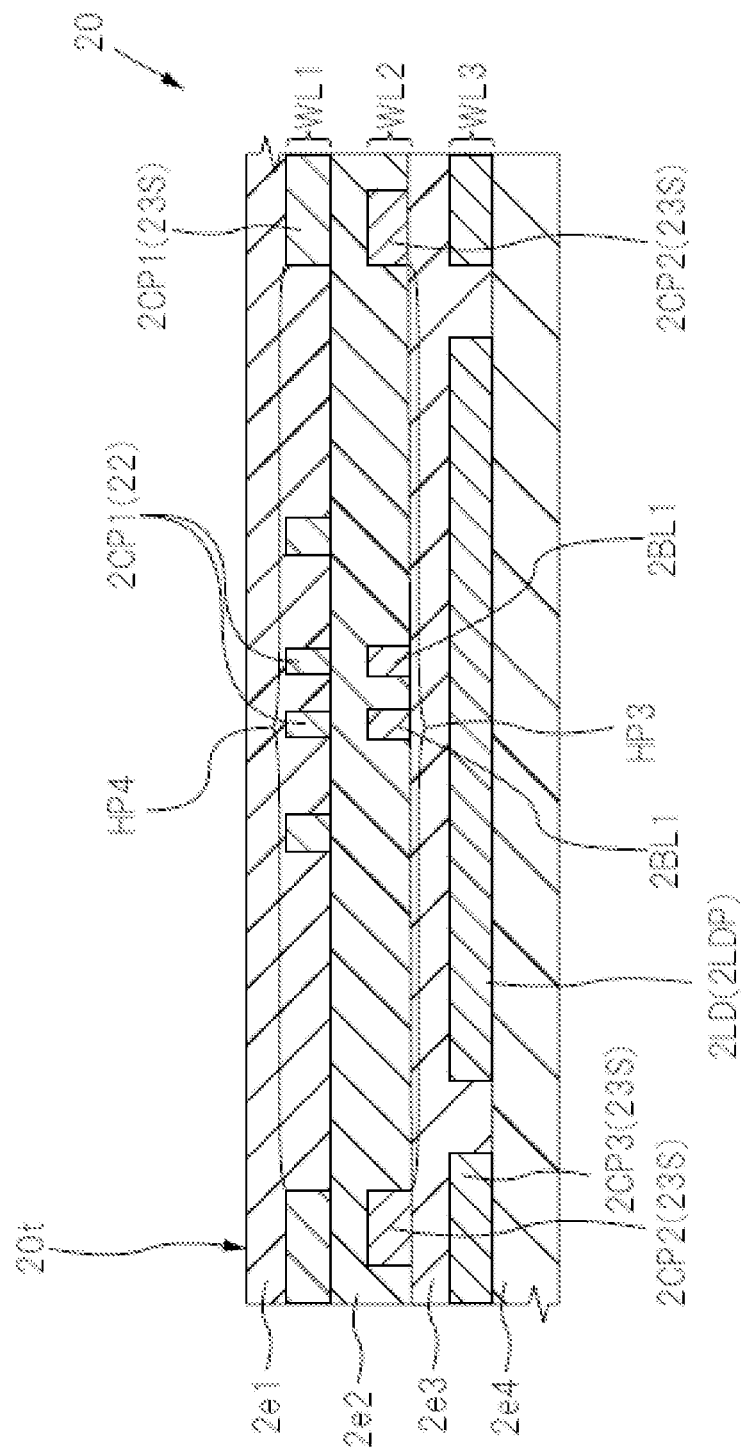
FIG. 13 is an enlarged cross-sectional view along line C-C shown in FIG. 12.

Next, a description will be given of the relationship between the conductive pattern 2CP2 shown in FIG. 7 and a plurality of land 2LD shown in FIG. 4. FIG. 11 is an enlarged plan view showing one of a plurality of land pads connected with the semiconductor chip shown in FIG. 4. FIG. 12 is an enlarged plan view showing the layout of the second wiring layer located at a position overlapping with the enlarged plan view shown in FIG. 11. FIG. 13 is an enlarged cross-sectional view along line C-C shown in FIG. 12.

Each of the plurality of external terminals 40 described with reference to FIG. 3 is connected to the land 2LD shown in FIG. 4. As shown in FIG. 4, a plurality of land 2LD includes a type in which a plurality of external terminals 40 are connected to one land 2LD and a type in which one external terminal 40 is connected to one land 2LD. In the following, a land 2LD of a type in which one external terminal 40 is connected to one land 2LD is referred to as a land pad 2LDP. The land 2LD of the type in which a plurality of external terminals 40 is connected to one land 2LD is comprised of a conductive pattern of a large area, as a common potential is to be supplied such as a reference potential or power supply potential to a plurality of external terminals 40. On the other hand, the land pad 2LDP is electrically connected with the semiconductor chip 10 composing a part of the signal transmitting line on which a signal is to be transmitted. Therefore, as illustrated in FIG. 11, it is necessary to be electrically separated the land pad 2LDP from the surrounding conductor pattern 2CP3. Also, the land pad 2LDP is patterned so as to have a size (area) such that one external terminal 40 can be connected thereto, for example, substantially circular (except for the portion where the via wiring 2v is connected).

The land pads 2LDP are formed on the lowermost wiring layer WL3 of the plurality of wiring layers of the wiring member 20. The land pad 2LDP pads a part of the signaling path. For example, the land pad 2LDP shown in FIG. 11 is connected to one of the differential signal wirings 22 shown in FIG. 5. In this case, the land pad 2LDP, when the parasitic capacitance is formed between the conductor pattern of the other wiring layer (e.g., the conductor pattern 2CP2 of the wiring layer WL2 shown in FIG. 12), the parasitic capacitance becomes noise in the signal transmission path. Further, depending on the magnitude of the parasitic capacitance, a communication error occurs in the signal transmission path.

Therefore, as shown in FIGS. 12 and 13, when the wiring member 20 of the present embodiment, the conductor pattern 2CP2 of the wiring layer WL2, at a position overlapping the land pad 2LDP (see FIG. 13), having an opening (land pad opening) HP3. By providing the opening portion HP3, since the conductor pattern 2CP2 is arranged so as not to overlap with the land pad 2LDP, the parasitic capacitance generated between the land pad 2LDP and the conductor pattern 2CP2 can be reduced.

Incidentally, the wiring member 20 of the present embodiment, the thickness of each wiring layer is thin, since the separation distance of each wiring layer is small, it is preferable to consider the parasitic capacitance between the ground plane 23S and the land pad 2LDP formed in the wiring layer WL1. Therefore, as shown in FIG. 13, the ground plane 23S of the wiring layer WL1, at a position overlapping the land pad 2LDP, having an opening (land pad opening) HP4. As a result, since the ground plane 23S of the wiring layer WL1 is disposed so as not to overlap with the land pad 2LDP, the parasitic capacitance generated between the land pad 2LDP and the ground plane 23S can be reduced.

From the viewpoint of reducing the parasitic capacitance as described above, provided with the opening portion HP3 in the conductor pattern 2CP2 of the wiring layer WL2, it is preferable that the conductor pattern 2CP2 and the land pad 2LDP do not overlap at all. However, considering the return current of the differential signal, in the vicinity of the differential signal wiring 22, a path on which a return current flows (e.g., a supply path of the reference potential) is preferably provided. If the differential signal wirings 22 are arranged so as to avoid the opening portion HP4 shown in FIG. 13, the above problems do not occur. However, in this instance, the layout of the land pad 2LDP constrains the layout of the differential signaling wires 22. Further, in this case, since the region overlapping the land pad 2LDP cannot be utilized as the arrangement space of the differential signal wiring 22, the arrangement density of the differential signal wiring 22 is reduced.

Therefore, in order to improve the arrangement density of the differential signal wiring 22, it is preferable to configure as illustrated in FIGS. 12 and 13. That is, in the example shown in FIGS. 12 and 13, each of the pair of differential signal wirings 22 is arranged at a position overlapping with the opening portion HP3 and the land pad 2LDP (reference FIG. 13). And, a pair of bypass wirings 2BL1 respectively extended along the pair of differential signal wirings 22 is arranged between the pair of differential signal wirings 22 and the land pad 2LDP. Incidentally, the pair of bypass wirings 2BL1 has two bypass wiring 2BL1. Also, one of the two bypass wiring 2BL1 (for example, left side in FIG. 12) is electrically connected one peripheral portions of the opening portion HP3 to each other. Similarly, the other one of the two bypass wiring 2BL1 (for example, right side in FIG. 12) is electrically connected the other one peripheral portions, which are different from the first peripheral portions, of the opening portion HP 3 to each other.

The bypass wiring 2BL1 is formed integrally with the conductor pattern 2CP2, and so as to overlap the differential signal wiring 22 extends along the extending direction of the differential signal wiring 22. Bypass routing 2BL1 is available as a transmission path of the return current to the signal flowing through the differential signal wiring 22.

Further, the bypass wiring 2BL1, since it is disposed between the differential signal wiring 22 and the land pad 2LDP, and the land pad 2LDP, it is possible to function as a shield layer for suppressing the generation of crosstalk noise between the differential signal wiring 22. Considering the function as a shielding layer of the bypass wiring 2BL1, the wiring width of the bypass wiring 2BL1 (length in the direction perpendicular to the extending direction) is preferably at least the wiring width of each of the differential signal wirings 22.

Further, the bypass wiring 2BL1, as described above, extends in a condition overlapping with the differential-signal wiring 22. However, such processing conditions, for manufacturing reasons, in the thickness direction of the wiring member 20, if the differential signal wiring 22 and the bypass wiring 2BL1 is slightly deviated, as described above, the bypass wiring 2BL1 is included in the state of extending along each of the pair of differential signal wiring 22.

The several modified examples have been described in the above embodiment, but in the following, typical modified examples other than the modified examples described in the above embodiments will be described.

Modified Example 1

Figure 14:
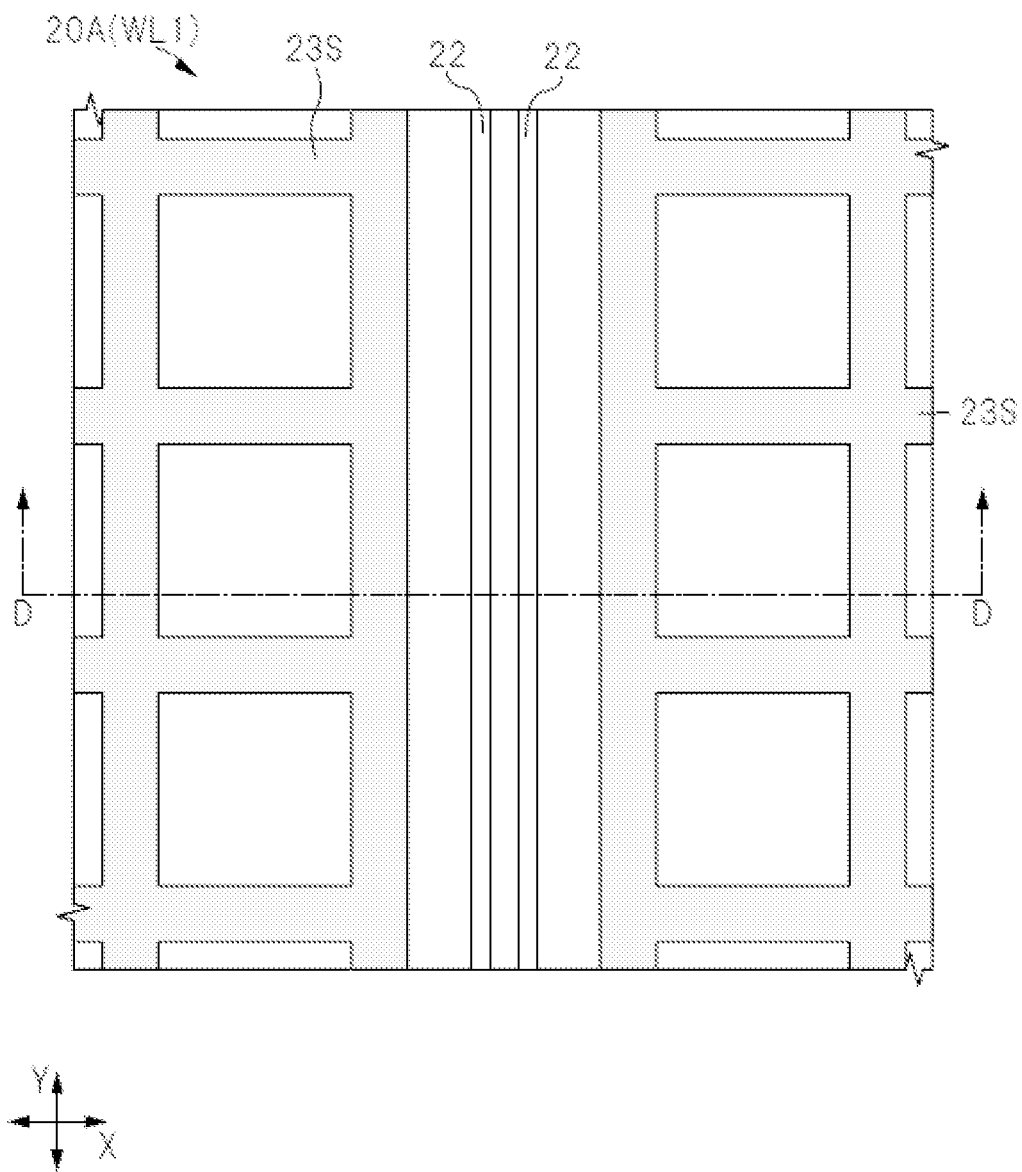
FIG. 14 is an enlarged plan view showing a layout of a first wiring layer of the semiconductor device according to a modified example with respect to FIG. 6.
Figure 15:
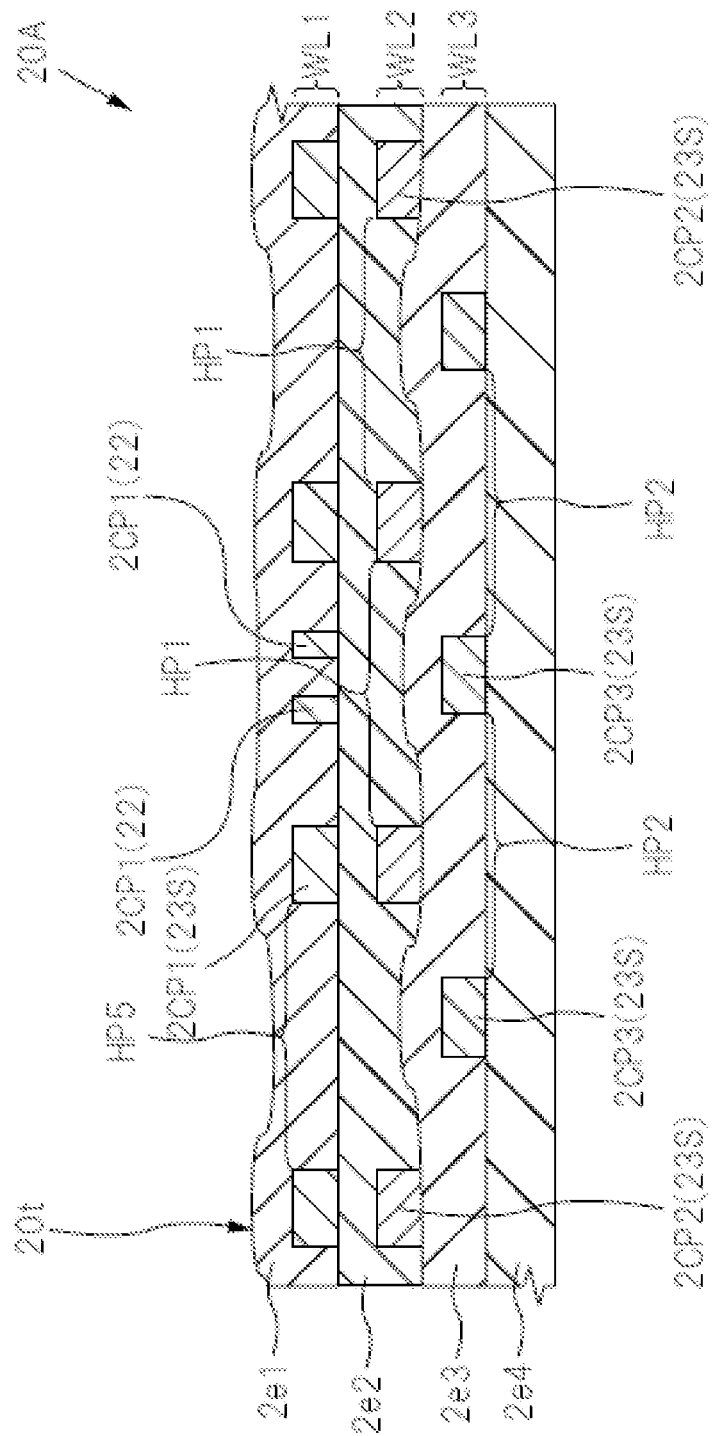
FIG. 15 is an enlarged cross-sectional view along line D-D shown in FIG. 14.

FIG. 14 is an enlarged plan view showing a layout of a first wiring layer of the semiconductor device according to a modified example with respect to FIG. 6. FIG. 15 is an enlarged cross-sectional view along line D-D shown in FIG. 14. A wiring member 20A of modified example shown in FIG. 14 is different from the wiring member 20 shown in FIG. 6 in that the ground plane 23S is a mesh pattern. A plurality of conductor patterns 2CP2 formed in the wiring layer WL1 is arranged around the pair of differential signal wirings, and includes a ground plane 23S that is a conductor pattern to which a reference potential is to be supplied. This point is the same as the example shown in FIG. 6. As shown in FIG. 14, the ground plane 23S is a mesh pattern having a plurality of opening portions HP5 each penetrating through the ground plane 23S in the thickness direction of the wiring member 20.

As described above, since the polyimide film has low adhesion to a metallic film such as copper, peeling may occur between the polyimide film 2e1 and the ground plane 23S Therefore, if the ground plane 23S is formed of a mesh pattern as in the present modified example, the contact area between the polyimide film 2e1 and 2e2 can be increased as in the case of the conductive patterns 2CP2 and 2CP3 described with reference to FIGS. 7 to 10, so that the occurrence of peeling between the polyimide film 2e1 and the ground plane 23S can be suppressed. Since the size of the opening portion HP5 and the shape of the mesh pattern of the ground plane 23S are the same as those of the conductive pattern 2CP2 shown in FIG. 7, the overlapped descriptions are omitted. Except for the differences described above, the wiring member 20A is the same as the wiring member 20 shown in FIGS. 2 to 13.

Incidentally, as in the present modified example, when the ground plane 23S formed on the uppermost wiring layer of the plurality of wiring layers (here, the wiring layer WL1), unlike the conductor pattern 2CP3 of the conductor pattern 2CP2 and the wiring layer WL3 of the wiring layer WL2, the polyimide film 2e1 high flatness is not required. Therefore, for example, as illustrated in FIG. 15, in the thickness direction of the wiring member 20A, may be disposed so as to overlap the peripheral portion of the peripheral edge portion and the opening portion HP5 of the opening portion HP1. In this instance, as shown in FIG. 15, upper surface of the polyimide film 2e1 becomes an uneven surface following the shape of the ground plane 23S.

Further, the ground plane 23 formed in the wiring layer WL1, it is possible to arbitrarily design the positional relationship between the conductor pattern 2CP2 of the wiring layer WL2, without inhibiting the degree of freedom of the wiring layout of the differential signal wiring 22, it is possible to place the ground plane 23S.

Modified Example 2

Further, as shown in FIG. 4, the wiring member 20 has been described as a wiring member comprising a wiring layer of three layers of the wiring layer WL1, WL2, and WL3. Therefore, as shown in FIG. 11, the land pad 2LDP is formed in the wiring layer WL3. Further, as shown in FIG. 5, a plurality of conductor patterns 2CP1 formed in the wiring layer WL1 includes a terminal 2PD which is electrically connected to the semiconductor chip.

However, as a modified example, there are cases where the number of wiring layers is four or more. Although not shown, the wiring member the number of wiring layers is four or more layers, when applying the technique described above, the differential signal wiring 22 may be formed in different wiring layers from the plurality of terminal 2PD. Further, the land pad 2LDP shown in FIG. 11 may be formed in a further lower layer of the wiring layer WL3.

Modified Example 3

In addition, for example, although various types of modified example have been described as described above, it is possible to combine modified example described above.

Although the invention made by the present inventor has been specifically described based on the embodiment, the present invention is not limited to the above embodiment, and it is needless to say that various modifications can be made without departing from the gist thereof.

What is claimed is:

1. A semiconductor device comprising:
   a wiring member including a plurality of wiring layers; and
   a semiconductor chip electrically connecting with the wiring member,
   wherein the plurality of wiring layers of the wiring member includes:
   a first wiring layer having a plurality of first conductive patterns each covered with a first polyimide film,
   a second wiring layer arranged next to the first wiring layer in a thickness direction of the wiring member, the second wiring layer having a second conductive pattern covered with a second polyimide film, and
   a third wiring layer arranged next to the second wiring layer in the thickness direction of the wiring member, the third wiring layer having a third conductive pattern covered with a third polyimide film,
   wherein the second wiring layer is arranged between the first wiring layer and the third wiring layer in the thickness direction of the wiring member,
   wherein the plurality of first conductive patterns of the first wiring layer includes first and second differential signal wirings through which a differential signal is to be transmitted,
   wherein the second conductive pattern of the second wiring layer is a first mesh pattern having a plurality of first opening portions, the plurality of first openings each penetrating through the second conductive pattern in the thickness direction of the wiring member,
   wherein the third conductive pattern of the third wiring layer is a second mesh pattern having a plurality of second opening portions, the plurality of second opening portions each penetrating through the third conductive pattern in the thickness direction of the wiring member,
   wherein the plurality of first opening portions of the second wiring layer includes two adjacent first opening portions, the two adjacent first opening portions being next to each other without having any first opening portions between the two adjacent first opening portions, and
   wherein, in plan view, each of the two adjacent first opening portions of the second wiring layer overlaps the first differential signal wiring of the first wiring layer, the second differential signal wiring of the first wiring layer, and two or more second opening portions of the plurality of second opening portions of the third wiring layer.

2. The semiconductor device according to claim 1,
   wherein a reference potential is to be supplied to the second conductive pattern,
   wherein the wiring member further includes a land pad formed in a lowermost layer of the plurality of wiring layers, and composing a part of a signal transmitting line,
   wherein the second conductive pattern has a third opening portion formed at a position overlapping the land pad,
   wherein the first and second differential signal wirings overlap the third opening portion and the land pad,
   wherein first and second bypass wirings respectively extend along the first and second differential signal wirings,
   wherein the first and second bypass wirings both are arranged between i) the first and second differential wirings and ii) the land pad,
   wherein the first bypass wiring is electrically connected to first peripheral portions of the third opening portion, and
   wherein the second bypass wiring is electrically connected to second peripheral portions of the third opening portion, the second peripheral portions being different from the first peripheral portions.

3. The semiconductor device according to claim 2,
   wherein the first bypass wiring extends between i) one portion of the first peripheral portions of the third opening portion and ii) another portion of the first peripheral portions of the third opening portion such that the first bypass wiring is electrically connected to the second conductive pattern, and
   wherein the second bypass wiring extends between i) one portion of the second peripheral portions of the third opening portion and ii) another portion of the second peripheral portions of the third opening portion such that the second bypass wiring is electrically connected to the second conductive pattern.

4. The semiconductor device according to claim 2, wherein the land pad is formed in the third wiring layer.

5. The semiconductor device according to claim 4,
   wherein the plurality of first conductive patterns formed in the first wiring layer has a ground plane that is a conductive pattern arranged around the first and second differential signal wirings, the reference potential being to be supplied to the ground plane, and
   wherein the ground plane is a third mesh pattern having a plurality of fourth opening portions, the plurality of fourth opening portions each penetrating through the ground plane in the thickness direction of the ground plane.

6. The semiconductor device according to claim 1, wherein a reference potential is to be supplied to each of the second conductive pattern and the third conductive pattern.

7. The semiconductor device according to claim 1, wherein the plurality of first conductive patterns formed in the first wiring layer has a terminal with which the semiconductor chip is electrically connected.

8. The semiconductor device according to claim 1, wherein, in plan view, each of the two adjacent first opening portions of the plurality of first opening portions overlaps four of the plurality of second opening portions.

9. The semiconductor device according to claim 1,
wherein each of the plurality of first opening portions of the second conductive pattern has a first opening width extending in a first direction,
wherein the second conductive pattern that is the first mesh pattern has a plurality of first extending portions each extending in a second direction and having a first width extending in the first direction, the second direction crossing the first direction, and
wherein the first opening width is larger than the first width.

10. The semiconductor device according to claim 9,
wherein each of the plurality of first opening portions has a second opening width extending in the second direction,
wherein the second conductive pattern that is the first mesh pattern has a plurality of second extending portion each extending in the first direction and having a second width extending in the second direction, and
wherein each of the first opening width and the second opening width is larger than each of the first width and the second width.

11. The semiconductor device according to claim 10,
wherein the third conductive pattern that is the second mesh pattern has a plurality of third extending portion each extending in the second direction and having a third width extending in the first direction, and
wherein the first opening width of the first opening portion is larger than the third width.

12. The semiconductor device according to claim 11,
wherein the third conductive pattern has a plurality of fourth extending portion each extending in the first direction and having a fourth width extending in the second direction, and
wherein each of the first opening width and the second opening width is larger than each of the third width and the fourth width.

13. The semiconductor device according to claim 1,
wherein each of the plurality of first opening portions has a first opening width extending in a first direction, and
wherein the first opening width is equal to or less than 1/16 against a wavelength of the differential signal to be transmitted through the first and second differential signal wirings.

14. The semiconductor device according to claim 1, wherein, in the second wiring layer, a total area of the plurality of first opening portions is equal to or larger than 50% of an area of the second conductive pattern including the plurality of first opening portions.

15. A semiconductor device comprising:
a wiring member including a plurality of wiring layers; and
a semiconductor chip electrically connecting with the wiring member,
wherein the plurality of wiring layers of the wiring member includes:
  a first wiring layer having a plurality of first conductive patterns each covered with a first polyimide film,
  a second wiring layer arranged next to the first wiring layer in a thickness direction of the wiring member, the second wiring layer having a second conductive pattern covered with a second polyimide film, and
  a third wiring layer arranged next to the second wiring layer in the thickness direction of the wiring member, the third wiring layer having a third conductive pattern covered with a third polyimide film,
wherein the second wiring layer is arranged between the first wiring layer and the third wiring layer in the thickness direction of the wiring member,
wherein the plurality of first conductive patterns of the first wiring layer includes first and second differential signal wirings through which a differential signal is to be transmitted,
wherein the second conductive pattern of the second wiring layer is a first mesh pattern having a plurality of first opening portions, the plurality of first openings each penetrating through the second conductive pattern in the thickness direction of the wiring member,
wherein the third conductive pattern of the third wiring layer is a second mesh pattern having:
  a plurality of second opening portions each penetrating through the third conductive pattern in the thickness direction of the wiring member, and
  an intersecting portion arranged within four of the plurality of second opening portions, the four of the plurality of second opening portions being arranged to be adjacent one another,
wherein the plurality of first opening portions of the second wiring layer includes two adjacent first opening portions, the two adjacent first opening portions being next to each other without having any first opening portions between the two adjacent first opening portions, and
wherein, in plan view, two adjacent first opening portions of the second wiring layer overlap the first differential signal wiring, the second differential signal wiring, and the intersecting portion.

16. The semiconductor device according to claim 15,
wherein a reference potential is to be supplied to the second conductive pattern,
wherein the wiring member further includes a land pad formed in a lowermost layer of the plurality of wiring layers, and composing a part of a signal transmitting line,
wherein the second conductive pattern has a third opening portion formed at a position overlapping the land pad,
wherein the first and second differential signal wirings overlap the third opening portion and the land pad,
wherein first and second bypass wirings respectively extend along the first and second differential signal wirings,
wherein the first and second bypass wirings both are arranged between i) the first and second differential wirings and ii) the land pad,
wherein the first bypass wiring is electrically connected to first peripheral portions of the third opening portion, and
wherein the second bypass wiring is electrically connected to second peripheral portions of the third opening portion, the second peripheral portions being different from the first peripheral portions.

17. The semiconductor device according to claim 16,
wherein the first bypass wiring extends between i) one portion of the first peripheral portions of the third opening portion and ii) another portion of the first peripheral portions of the third opening portion such that the first bypass wiring is electrically connected to the second conductive pattern, and
wherein the second bypass wiring extends between i) one portion of the second peripheral portions of the third opening portion and ii) another portion of the second peripheral portions of the third opening portion such that the second bypass wiring is electrically connected to the second conductive pattern.

18. The semiconductor device according to claim 17, wherein the land pad is formed in the third wiring layer.

19. The semiconductor device according to claim 18,
wherein the plurality of first conductive patterns formed in the first wiring layer has a ground plane that is a conductive pattern arranged around the first and second differential signal wirings, the reference potential being to be supplied to the ground plane, and
wherein the ground plane is a third mesh pattern having a plurality of fourth opening portions, the plurality of fourth opening portions each penetrating through the ground plane in the thickness direction of the ground plane.

20. The semiconductor device according to claim 15, wherein, in plan view, each of the two adjacent first opening portions of the plurality of first opening portions overlaps four of the plurality of second opening portions.

* * * * *